United States Patent
Lee et al.

(10) Patent No.: US 10,212,367 B2
(45) Date of Patent: Feb. 19, 2019

(54) IMAGE SENSOR AND ELECTRONIC DEVICE INCLUDING THE SAME

(71) Applicant: Samsung Electronics Co., Ltd., Suwon-si, Gyeonggi-do (KR)

(72) Inventors: Kwang Hee Lee, Hwaseong-si (KR); Young Gu Jin, Suwon-si (KR); Yong Wan Jin, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 47 days.

(21) Appl. No.: 15/435,397

(22) Filed: Feb. 17, 2017

(65) Prior Publication Data

US 2018/0013961 A1 Jan. 11, 2018

(30) Foreign Application Priority Data

Jul. 11, 2016 (KR) .................. 10-2016-0087401

(51) Int. Cl.
*H04N 5/33* (2006.01)
*H01L 27/00* (2006.01)
(Continued)

(52) U.S. Cl.
CPC ......... *H04N 5/332* (2013.01); *H01L 27/1464* (2013.01); *H01L 27/14605* (2013.01);
(Continued)

(58) Field of Classification Search
CPC ........ H04N 5/332; H04N 5/359; H04N 5/374; H04N 5/3742; H04N 5/378; H01L 27/286; H01L 27/307
See application file for complete search history.

(56) References Cited

U.S. PATENT DOCUMENTS 5,965,875 A * 10/1999 Merrill ............. H01L 27/14623
250/208.1
8,633,557 B2 1/2014 Kim et al.
(Continued)

FOREIGN PATENT DOCUMENTS

JP 2011/192669 A 9/2011
JP 2013055252 A 3/2013
(Continued)

OTHER PUBLICATIONS

European Search Report for Application No. 17180824.9 dated Feb. 20, 2018.

*Primary Examiner* — Peniel M Gumedzoe
(74) *Attorney, Agent, or Firm* — Harness, Dickey & Pierce, P.L.C.

(57) ABSTRACT

An image sensor includes a plurality of pixels, each pixel including a light sensing structure including first, second and third light sensing elements sequentially stacked on a substrate, the light sensing structure having a first surface adjacent to a readout circuit and a second surface including a light receiving portion between first and second circumferential portions, a first through via on the first circumferential portion, extending from the first surface to connect with the first light sensing element, and configured to transfer charges of the first light sensing element to the readout circuit, and a vertical transfer gate on a second circumferential portion and configured to transfer charges of the second light sensing element to the readout circuit, the first through via and the vertical transfer gate of each pixel being arranged in a 1-shaped or L-shaped pattern in the first and second circumferential portions.

28 Claims, 26 Drawing Sheets

(51) Int. Cl.
 *H01L 27/28* (2006.01)
 *H04N 5/359* (2011.01)
 *H04N 5/378* (2011.01)
 *H04N 5/374* (2011.01)
 *H01L 27/146* (2006.01)
 *H01L 27/30* (2006.01)

(52) U.S. Cl.
 CPC .. *H01L 27/14614* (2013.01); *H01L 27/14629* (2013.01); *H01L 27/14636* (2013.01); *H01L 27/14638* (2013.01); *H01L 27/14641* (2013.01); *H01L 27/14647* (2013.01); *H01L 27/14652* (2013.01); *H01L 27/286* (2013.01); *H04N 5/359* (2013.01); *H04N 5/374* (2013.01); *H04N 5/378* (2013.01); *H04N 5/3742* (2013.01); *H01L 27/307* (2013.01)

(56) References Cited

U.S. PATENT DOCUMENTS

| | | | |
|---|---|---|---|
| 8,790,949 B2 | 7/2014 | Nakamura | |
| 8,792,035 B2 | 7/2014 | Yamada | |
| 8,941,198 B2 | 1/2015 | Enomoto | |
| 8,981,275 B2 | 3/2015 | Toumiya et al. | |
| 9,018,688 B2 | 4/2015 | Yamaguchi | |
| 2008/0240747 A1* | 10/2008 | Ikami | G01N 21/6456 399/32 |
| 2008/0265352 A1 | 10/2008 | Akiyoshi | |
| 2009/0303371 A1* | 12/2009 | Watanabe | H01L 27/14603 348/311 |
| 2010/0123070 A1 | 5/2010 | Natori | |
| 2012/0193689 A1* | 8/2012 | Park | H01L 27/307 257/290 |
| 2015/0001376 A1 | 1/2015 | Miyanami | |
| 2015/0221692 A1 | 8/2015 | Enomoto et al. | |
| 2016/0204156 A1 | 7/2016 | Togashi | |
| 2017/0148841 A1 | 5/2017 | Matsumoto et al. | |

FOREIGN PATENT DOCUMENTS

| | | |
|---|---|---|
| JP | 5700106 B2 | 4/2015 |
| WO | WO-2015/025723 A1 | 2/2015 |
| WO | WO-2016/002576 A1 | 1/2016 |

* cited by examiner

IMAGE SENSOR AND ELECTRONIC DEVICE INCLUDING THE SAME

CROSS-REFERENCE TO RELATED APPLICATION

This application claims priority to and the benefit of Korean Patent Application No. 10-2016-0087401 filed in the Korean Intellectual Property Office on Jul. 11, 2016, the entire contents of which are incorporated herein by reference.

BACKGROUND

(a) Field

Example embodiments relate to an image sensor and an electronic device including the same.

(b) Description of the Related Art

An image sensor for photographing an object and storing a thus-obtained image as an electrical signal is employed in a digital camera, a mobile phone camera, a PC camera, a camcorder, etc. In example embodiments, the image sensor decomposes introduced light depending on wavelengths and converts thus-obtained components into electrical signals.

The image sensor increasingly needs to be downsized. Recently, an image sensor having a stacked structure has been researched to reduce a size thereof. When the stacked-structure image sensor is formed, charges accumulated in a light sensing element need to be transferred using a different method from that of the conventional image sensor, and requires improved or optimized arrangement of constituent elements.

The above information disclosed in this Background section is only for enhancement of understanding of the background of the inventive concepts and therefore it may contain information that is not prior art, but already known in this country to a person of ordinary skill in the art.

SUMMARY

Example embodiments provide a stacked-structure image sensor capable of not only increasing the number of pixels but also maintaining sensitivity of the pixels.

Example embodiments also provide an image sensor capable of improving electrical and optical crosstalk between adjacent pixels.

Example embodiments also provide an image sensor capable of improving a fill factor.

According to example embodiments, an image sensor includes a plurality of pixels, each of the pixels including a light sensing structure including a first light sensing element, a second light sensing element, and a third light sensing element sequentially stacked on a substrate, the light sensing structure having a first surface and a second surface, the first surface adjacent to a readout circuit and the second surface including a light receiving portion between first and second circumferential portions on either side of the light receiving portion, a first through via on the first circumferential portion of the second surface and extending from the first surface to connect with the first light sensing element, the first through via configured to transfer charges of the first light sensing element to the readout circuit, and a vertical transfer gate on the second circumferential portion of the second surface, the vertical transfer gate configured to transfer charges of the second light sensing element to the readout circuit, wherein the first through via and the vertical transfer gate of each of the plurality of pixels are arranged in one of a 1-shaped and L-shaped pattern in the respective first and second circumferential portions.

According to example embodiments, an image sensor includes a plurality of pixels, each of the pixels including a light sensing structure including a first light sensing element, a second light sensing element, and a third light sensing element sequentially stacked on a substrate, the light sensing structure having a first surface and a second surface, the first surface adjacent to a readout circuit and the second surface including a light receiving portion and a circumferential portion on one side of the light receiving portion, a first through via on the circumferential portion of the second surface and extending from the first surface to connect with the first light sensing element, the first through via configured to transfer charges of the first light sensing element to the readout circuit, and a second through via on the circumferential portion of the second surface and extending from the first surface to connect with the second light sensing element, the second through via configured to transfer charges of the second light sensing element to the readout circuit, wherein the first through via and the second through via of each of the plurality of pixels are arranged in one of a 1-shaped and L-shaped pattern in the circumferential portion.

According to example embodiments, an image sensor includes a plurality of pixels, each of the pixels including a light sensing structure including a first light sensing element, a second light sensing element, and a third light sensing element sequentially stacked on a substrate, the light sensing structure having a first surface and a second surface, the first surface adjacent to a readout circuit and the second surface including a light receiving portion, a first through via extending from the first surface to connect with the first light sensing element, the first through via configured to transfer charges of the first light sensing element to the readout circuit, and a vertical transfer gate configured to transfer charges of the second light sensing element to the readout circuit, wherein adjacent pixels of the plurality of pixels are electrically isolated by an insulating layer along an inner side wall of the first through via and a gate insulating layer of the vertical transfer gate.

According to example embodiments, an image sensor includes a plurality of pixels, each of the pixels including a light sensing structure including a first light sensing element, a second light sensing element, and a third light sensing element sequentially stacked on a substrate, the light sensing structure having a first surface and a second surface, the first surface adjacent to a readout circuit and the second surface including a light receiving portion, a first through via extending from the first surface to connect with the first light sensing element, the first through via configured to transfer charges of the first light sensing element to the readout circuit, and a second through via extending from the first surface to connect with the second light sensing element, the second through via configured to transfer charges of the second light sensing element to the readout circuit, wherein adjacent pixels of the plurality of pixels are electrically isolated by an insulating layer along inner side walls of the first through via and the second through via.

Example embodiments of a stacked-structure image sensor are capable of not only increasing the number of pixels but also maintaining sensitivity of the pixels by realizing an image sensor with a stacking type light sensing element structure.

The stacked-structure image sensor of example embodiments improves signal precision by forming a through via and a vertical transfer gate or a plurality of through vias using a deep trench isolation method and forming an insulating layer in inner side walls thereof so as to block inflow of light from adjacent pixels. The stacked-structure image sensor of example embodiments also improves signal precision by blocking leakage of light introduced into a corresponding pixel into pixels adjacent thereto so as to suppress optical crosstalk and blocking a flow of charges between pixels so as to suppress electrical crosstalk.

An occupation area of the light-receiving portion or area can be increased by alternatively disposing the through via and the vertical transfer gate or a plurality of through vias in an external circumferential portion of the light-receiving portion or area to perform a deep trench isolation function, thereby improving a fill factor.

DETAILED DESCRIPTION

Figure 1:
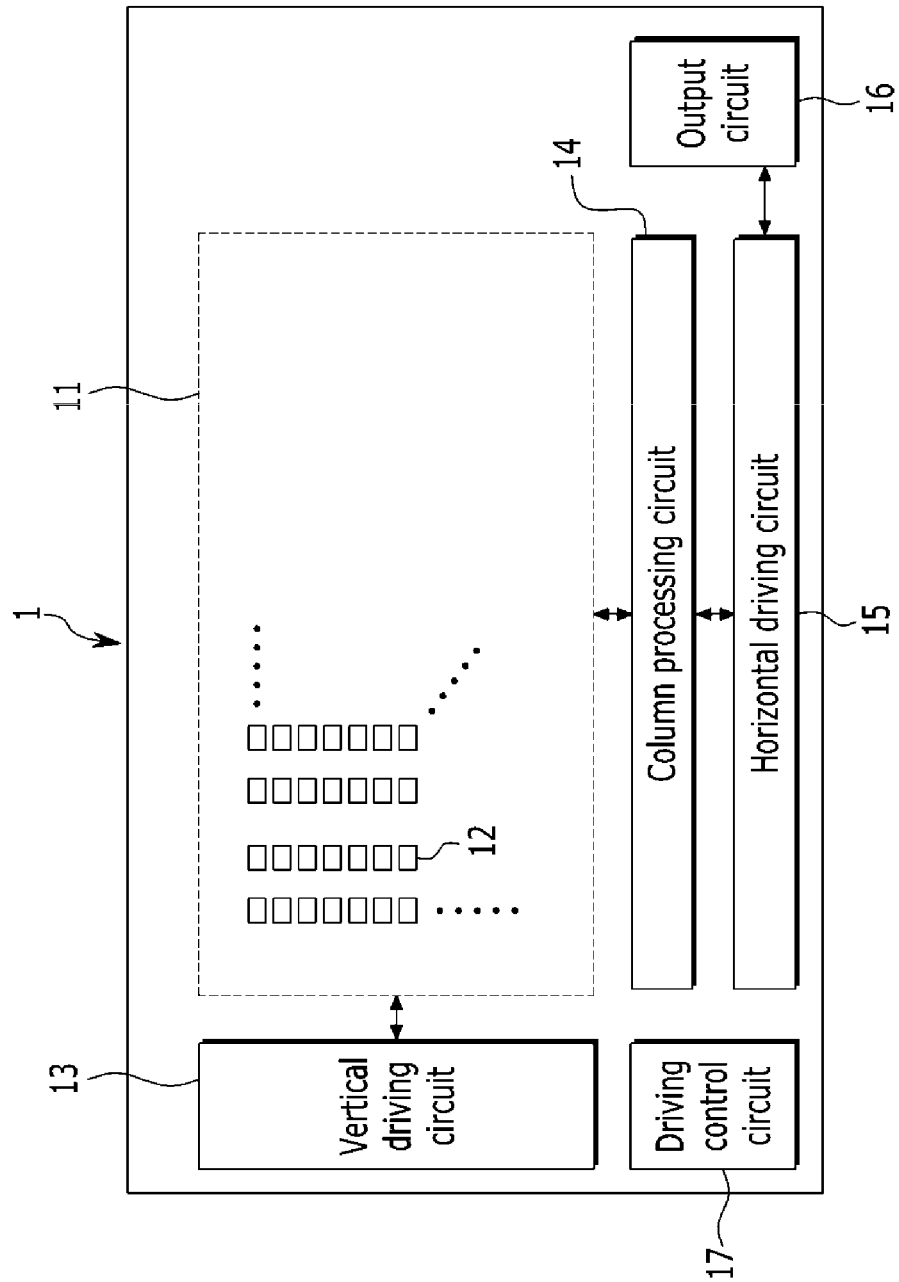
FIG. 1 is a schematic diagram illustrating an image processing device according to example embodiments.

It will be apparent to those skilled in the art that various modifications and variations can be made in the present inventive concepts without departing from the spirit or scope of the inventive concepts, and specific example embodiments are exemplified in the drawings and explained in the detailed description. Thus, it is intended for the present inventive concepts to cover modifications and variations of this inventive concepts provided they fall within the scope of the present inventive concepts and their equivalents. Like reference numerals designate like elements throughout the specification and the drawings. In the accompanying drawings, sizes of structures may be enlarged or reduced for clearness of the present inventive concepts.

Terms used in the present specification are used only to describe specific example embodiments, and are not intended to limit the present inventive concepts. Singular expressions used herein include plural expressions unless they have definitely opposite meanings in the context. In the present specification, it will be appreciated that terms "including" and "having" are intended to designate the existence of characteristics, numbers, steps, operations, constituent elements, and components described in the specification or a combination thereof, and do not exclude a possibility of the existence or addition of one or more other characteristics, numbers, steps, operations, constituent elements, and components, or a combination thereof in advance.

All terms used herein including technical or scientific terms have the same meanings as meanings which are generally understood by those skilled in the technical field to which the present inventive concepts pertains (those skilled in the art) unless they are differently defined. Terms defined in a generally used dictionary shall be construed to have meanings matching those in the context of a related art, and shall not be construed to have ideal or excessively formal meanings unless they are clearly defined in the present specification.

FIG. 1 is a schematic diagram illustrating an image processing device 1 according to example embodiments. The image processing device 1 may include a CMOS-type image sensor. The image processing device 1 includes a pixel area 11 in which a plurality of pixels 12 are disposed to have a matrix shape, and peripheral circuits. The image processing device 1 includes a vertical driving circuit 13, a column processing circuit 14, a horizontal driving circuit 15, an output circuit 16, and a driving control circuit 17 as the peripheral circuits.

The vertical driving circuit 13 serves to sequentially select the pixels 12 in a row unit. The column processing circuit 14 serves to perform a correlated double sampling (CDS) treatment on a pixel signal outputted from each pixel 12 of a row selected by the vertical driving circuit 13. The column processing circuit 14 extracts a signal level of the pixel signal by, e.g., performing the CDS treatment to extract pixel data depending on an amount of received light of each pixel 12. The horizontal driving circuit 15 serves to sequentially output pixel data supported by the column processing circuit 14 to the output circuit 16. The output circuit 16 serves to amplify, e.g., inputted pixel data, and output it to an external signal processing circuit. The driving control circuit 17 serves to control driving of each block (the vertical driving circuit 13, the column processing circuit 14, the horizontal driving circuit 15, and the output circuit 16) in the peripheral circuits, for example.

Figure 2:
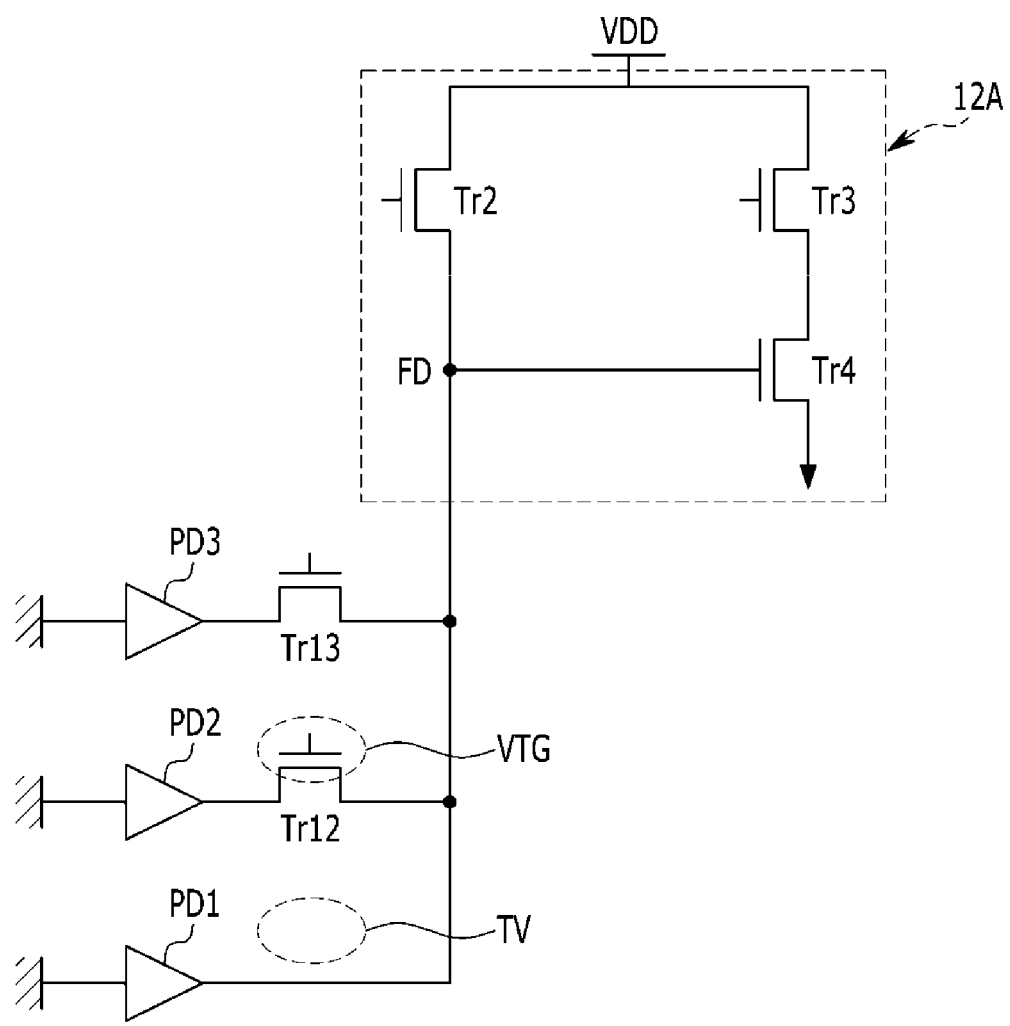
FIG. 2 illustrates an equivalent circuit diagram of a pixel of an image processing device according to example embodiments.

FIG. 2 illustrates an equivalent circuit diagram of each pixel 12 of the image processing device 1 according to the example embodiments. Each pixel 12 includes light sensing elements PD1, PD2, and PD3 connected in parallel with each other. In example embodiments, the light sensing elements PD2 and PD3 may serve as inorganic light sensing elements formed in a silicon substrate, and the light sensing element PD1 may serve as an organic light sensing element. Each of the three light sensing elements PD1, PD2, and PD3 may include a readout circuit. However, as shown in FIG. 2, except for transfer transistors Tr12 and Tr13, sharing a readout circuit 12A may be advantageous in view of increasing or maximizing an area of a light-receiving portion of the image processing device. The readout circuit 12A includes a reset transistor Tr2, a selecting transistor Tr3, and an amplifying transistor Tr4 connected with a floating diffusion unit FD. Each of the transfer transistors Tr12 and Tr13, the reset transistor Tr2, the selecting transistor Tr3, and the amplifying transistor Tr4 may be configured as an n-channel MOS transistor.

Photoelectric conversion is performed by each of the inorganic light sensing elements PD2 and PD3. Charges (e.g., electrons) accumulated therein are transferred to the floating diffusion unit FD connected to a gate of the amplifying transistor Tr4 to be accumulated when transmitting pulses are respectively applied to the transfer transistors Tr12 and Tr13 corresponding thereto. The charges (e.g., electrons) accumulated in the organic light sensing element PD1 are directly transferred to the floating diffusion unit FD connected to the gate of the amplifying transistor Tr4 without using any transfer transistor.

When the reset transistor Tr2 is turned on, a potential of the floating diffusion unit FD is reset by a potential of a power supply line VDD. The selecting transistor Tr3 controls timing at which a pixel signal is outputted by the readout circuit 12A. The amplifying transistor Tr4 constitutes a source-following amplifier, and outputs pixel signals of voltages depending on levels of charges generated in the light sensing elements PD1, PD2, and PD3. When the selecting transistor Tr3 is turned on, the amplifying transistor Tr4 amplifies the potential of the floating diffusion unit FD and outputs a voltage depending on the potential thereof to the column processing circuit 14 (see FIG. 1).

In FIG. 2, an upper dotted-line ellipse indicates a vertical transfer gate VTG as a gate of a transfer transistor TR12 of the inorganic light sensing element PD2, and a lower dotted-line ellipse indicates a through via TV for transferring the charges of the organic light sensing element PD1. Their disposal relationship and cross-sectional structure will be described with reference to FIG. 3 and FIG. 4.

Figure 3:
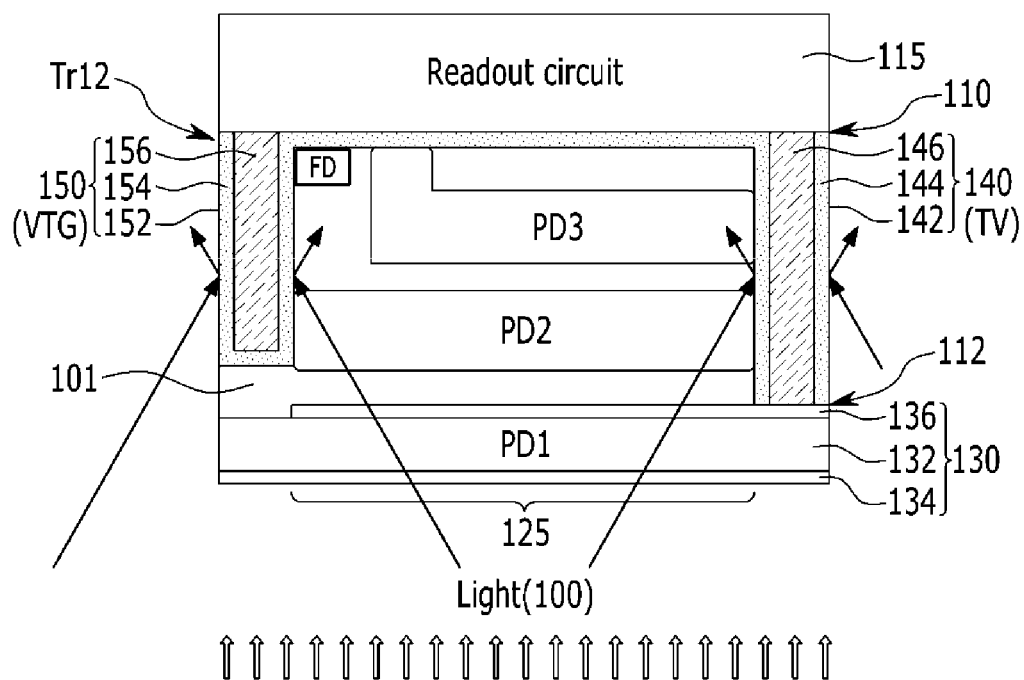
FIG. 3 illustrates a cross-sectional view of an image sensor pixel according to example embodiments.

FIG. 3 illustrates a cross-sectional view of an image sensor pixel according to example embodiments. FIGS. 4 to 7 illustrate various layouts of an image sensor pixel illustrated in FIG. 3.

Referring to FIG. 3, according to a recent integration trend of the pixel area 11, a unit pixel 12 has a triple-stacking light sensing element structure in which the first to third light sensing elements PD1, PD2, and PD3 are sequentially stacked.

The triple-stacking light sensing element structure is configured by stacking the two light sensing elements PD2 and PD3 which are stacked and disposed in a Si substrate 101 and the organic light sensing element PD1 including an organic photoelectric conversion layer having autonomous wavelength selectivity. As such, increasing the number of pixels may be possible by employing this triple-stacking light sensing element structure as compared with a conventional flat light sensing element array. Further, when pixels are formed at a same integration degree as the conventional art, the pixels can be formed to have a larger size than that of the conventional art, thereby improving sensitivity. The organic light sensing element can be more easily embodied using an organic electronic material configured to selectively absorb light of a specific wavelength among visible light and perform photoelectric conversion on the light, and may be applied to a stacked structure formation.

The image sensor employing the triple-stacking light sensing element structure may be formed as a back-side illumination (BSI) image sensor obtained by forming a readout circuit 115 on a readout circuit formation surface 110 of the substrate 101 and disposing a light-receiving portion or area 125 on the opposite side. Alternatively, the image sensor may be formed to have a stacked structure obtained by respectively processing a pixel-integrating portion for light integration and the readout circuit 115 on two different wafers and bonding the two wafers. In addition to the wafer-bonding method, a through silicon via (TV) may also be used for the stacked structure.

There are merits for easy wafer handling and no necessity to form a deep via hole (e.g., a TV) in the case of respectively processing the pixel-integrating portion and the readout circuit 115 on different wafers and bonding the wafers.

The organic light sensing element PD1 (or 130) includes an organic photoelectric conversion layer 132 and a first electrode 134 and a second electrode 136 disposed on opposite surfaces thereof. The organic photoelectric conversion layer 132 may include a p-type semiconductor and an n-type semiconductor, and the p-type semiconductor and the n-type semiconductor may constitute a pn junction. The organic photoelectric conversion layer 132 may selectively absorb a specific wavelength of visible light to form excitons, and may divide the formed excitons into holes and electrons such that the divided holes may be transferred to the first electrode 134 serving as a common electrode and the divided electrons may be transferred to the second electrode 136 serving as a pixel electrode so as to obtain a photoelectric effect. Accordingly, the first electrode 134 is connected as a single electrode throughout an entire area of the image sensor or a partial area thereof, and the second electrode is separately patterned for each pixel.

When the organic light sensing element PD1 selectively absorbs green light having a maximum absorption wavelength ($\lambda$max) in a range of 500 nm to 600 nm, the second light sensing element PD2 may selectively absorb blue light having a maximum absorption wavelength ($\lambda$max) in a range of about 400 nm to smaller than 500 nm. The second light sensing element PD2 may be formed about 1 μm depth from a rear surface 112 of the substrate 101. The third light sensing element PD3 may be a light sensing element for red light with a maximum absorption wavelength ($\lambda$max) in a range of greater than about 600 nm to 700 nm, and may be formed about 6 μm depth from a rear surface 112 of the substrate 101. When a light sensing element that selectively absorbs green light is formed as the organic light sensing element PD1, an existing logic circuit may be applied as is.

Accordingly, when the logic circuit can be changed, the light sensing elements may be arranged such that absorption can be performed from a short wavelength to a long wavelength. Accordingly, the first light sensing element PD1, the second light sensing element PD2, and the third light sensing element PD3 may be light sensing elements for blue light, green light, and red light. In example embodiments, the second light sensing element PD2 may be about 3 μm depth from the rear surface of the substrate 101, and the third light sensing element PD3 may be an about 6 μm depth therefrom.

The charges of the organic light sensing element PD1 are transferred to the readout circuit 115 using a through via 140 (or TV) extending from the readout circuit formation surface 110 to connect to the organic light sensing element PD1. The through via 140 includes an insulating layer 144 formed in an inner side wall of a via hole 142 formed to extend through the substrate 101 and a conductive layer 146 formed on the insulating layer 144 to bury the via hole 142.

The through via 140 is connected with the second electrode 136 which serves as the pixel electrode of the organic light sensing element PD1 by extending through the substrate 100.

The charges of the second light sensing element PD2 are transferred to the floating diffusion unit FD through the vertical transfer transistor Tr12. Specifically, a vertical transfer gate 150 (or VTG) of the vertical transfer transistor Tr12 includes a gate insulating layer 154 formed in an inner side wall and a bottom surface of a trench 152 formed in the substrate 101 to contact the second light sensing element PD2, and a vertical transfer gate electrode 156 formed on the gate insulating layer 154 to bury the trench 152. When an on-signal is applied to the vertical transfer gate electrode 156, a channel region (not illustrated) is formed in a surface of the substrate 101 that contacts the vertical transfer gate electrode 156 by interposing the gate insulating layer 154 therebetween. The charges of the second light sensing element PD2 are transferred to the floating diffusion unit FD along the channel region (not illustrated).

According to example embodiments, adjacent pixels constitute a deep trench isolation (DTI) by the insulating layer 144 of the through via 140 and the gate insulating layer 154 of the vertical transfer gate 150. Various layouts for effectively accomplishing isolation of adjacent pixels are illustrated in FIGS. 4 to 7.

Referring to FIGS. 4 to 7, the through via 140 and the vertical transfer gate 150 are disposed in an external circumferential surface or circumferential portion of the light-receiving portion or area 125 in which the three light sensing element PD1, PD2, and PD3 are stacked.

Figure 4:
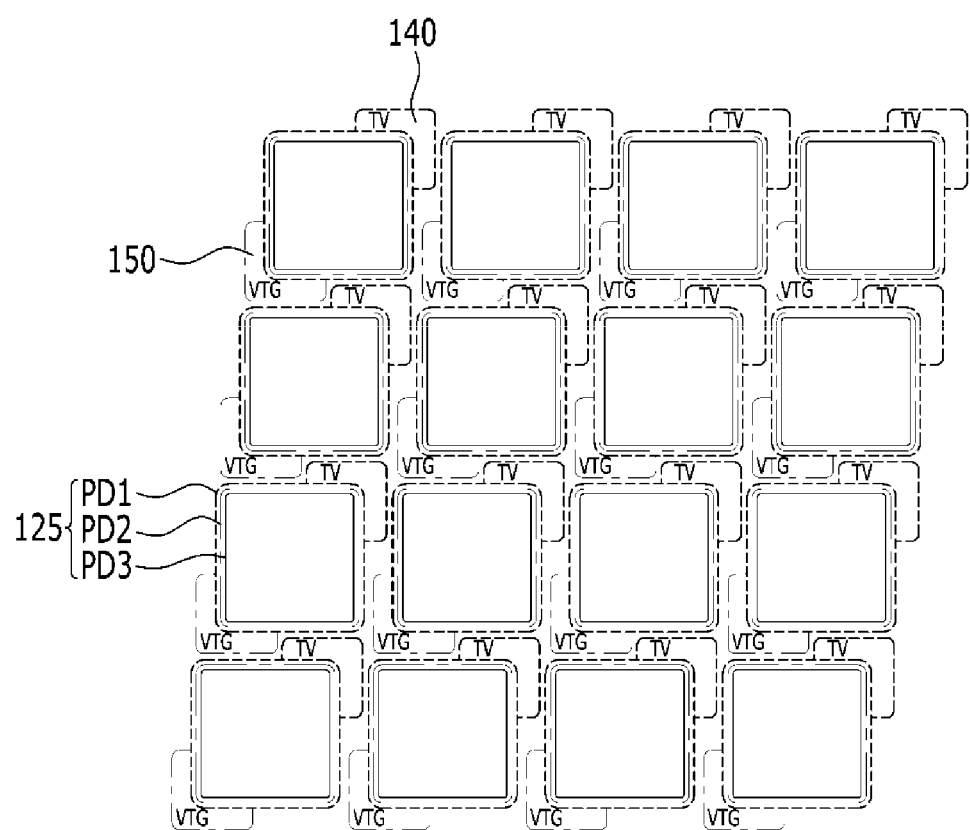
FIGS. 4 to 7 illustrate various layouts of an image sensor pixel illustrated in FIG. 3.
Figure 5:
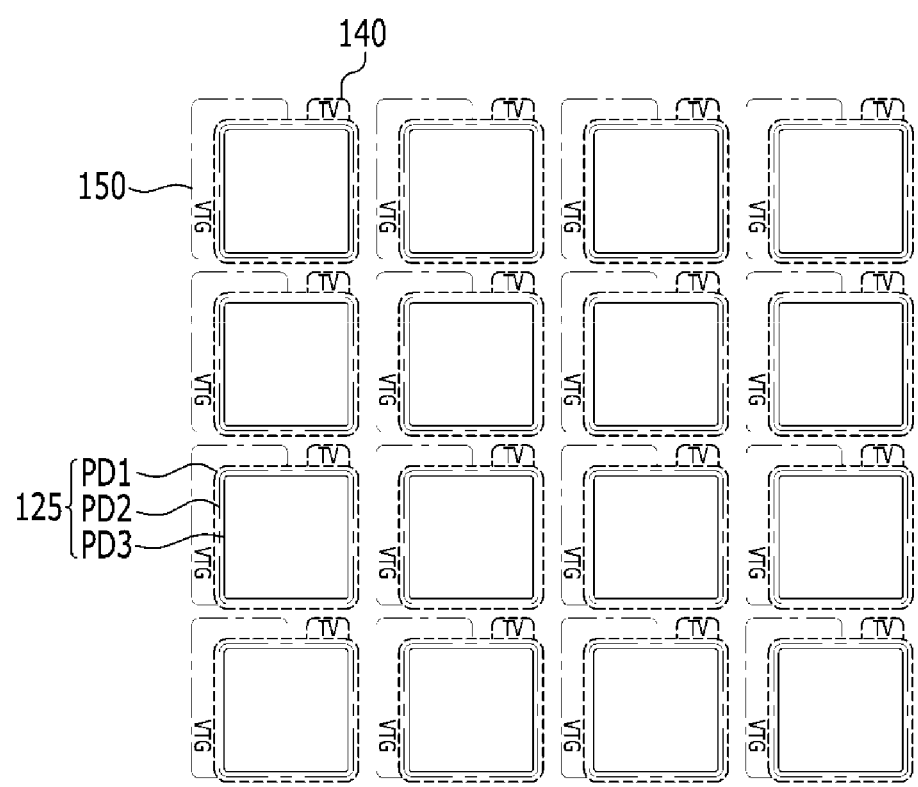
Figure 6:
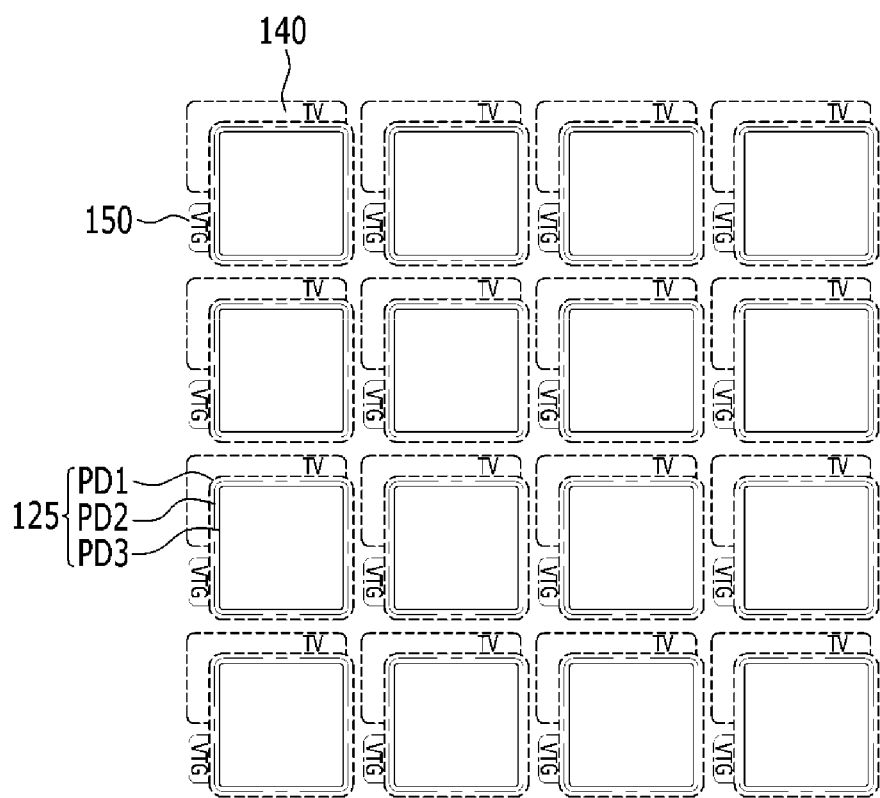
Figure 7:
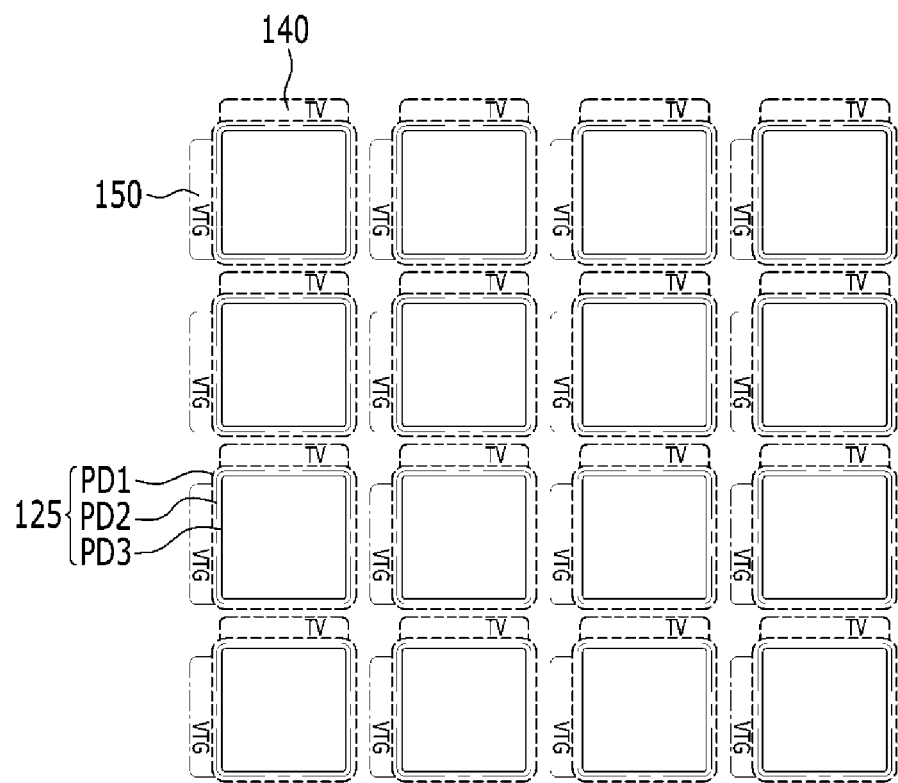

FIG. 4 illustrates a case in which the through via 140 and the vertical transfer gate 150 are disposed in an L-shaped pattern in the external circumferential surface or circumferential portion of the light-receiving portion or area 125. FIG. 5 illustrates a case in which the through via 140 is disposed in a 1-shaped pattern and the vertical transfer gate 150 is disposed in the L-shaped pattern. FIG. 6 illustrates a case in which the through via 140 is disposed in the L-shaped pattern and the vertical transfer gate 150 is disposed in the 1-shaped pattern. FIG. 7 illustrates a case in which both the through via 140 and the vertical transfer gate 150 are disposed in the 1-shaped pattern.

As illustrated in FIGS. 4 to 7, the through via 140 and the vertical transfer gate 150 may be disposed in less than half an area of the external circumferential surface or circumferential portion of the light-receiving portion or area 125 to thereby improve or optimize the DTI between light-receiving portion or areas 125 of pixels. Further, accomplishing effective DTI between adjacent pixels may be possible by forming the through via 140 and the vertical transfer gate 150 through less than half an area of the external circumferential surface or circumferential portion of the light-receiving portion or area 125 as the DTI between the light-receiving portions or areas 125 of the pixels.

In addition, an occupation area of the light-receiving portion or area 125 can be increased by disposing the through via 140 and the vertical transfer gate 150 outside the light-receiving portion or area 125, thereby improving a fill factor.

Furthermore, the through via 140 and the vertical transfer gate 150 can be designed in the 1 or L shape to simplify processes, thereby improving processability.

Referring again to FIG. 3, the insulating layer 144 constituting the through via 140 and the gate insulating layer 154 of the vertical transfer transistor Tr12 may be formed of a material having a lower refractive index than that of the material of the substrate 101, thereby improving optical crosstalk. In example embodiments, the insulating layer 144 and the gate insulating layer 154 may be formed together using a same material.

When the insulating layer 144 constituting the through via 140 and the gate insulating layer 154 of the vertical transfer transistor Tr12 is formed of a material having a lower refractive index than that of the material of the substrate 101, light 100 introduced into the through via 140 and the vertical transfer gate 150 may be reflected by the through via 140 and the vertical transfer gate 150 by the action of total reflection in the case that an incidence angle of the light 100 is larger than a critical angle. Accordingly, inflow of the light 100 from the outside of the unit pixel can be blocked, and leakage of the light 100 introduced into a pixel to another pixel adjacent thereto can be blocked, thereby improving the optical crosstalk.

The conductive layer 146 of the through via 140 and the gate electrode 156 may be formed of tungsten, aluminum, copper, or doped silicon, or a material obtained by combining a metal with the doped silicon.

Figure 8:
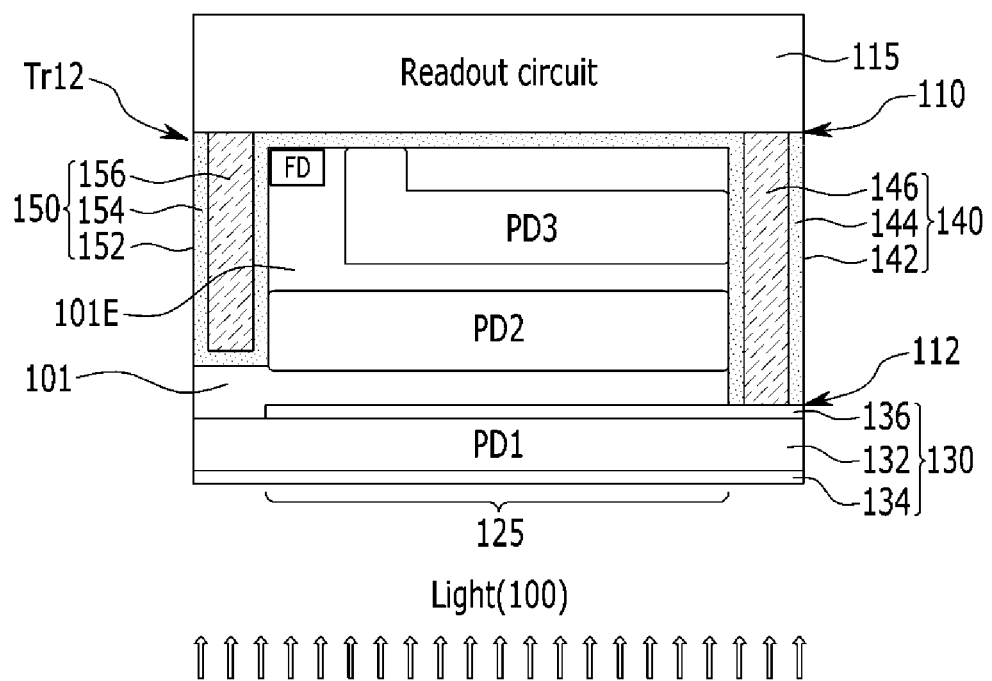
FIG. 8 illustrates a cross-sectional view of an image sensor pixel according to example embodiments.

FIG. 8 illustrates a cross-sectional view of an image sensor pixel according to example embodiments. Referring to FIG. 8, different from the image sensor shown in FIG. 3, the second light sensing element PD2 is formed in the silicon substrate 101, and the third light sensing element PD3 is formed in an epitaxial layer 101E. Accordingly, the through via 140 is formed to extend through the epitaxial layer 101E and the silicon substrate 101, and the trench 152 in which the vertical transfer gate 150 is formed is extended through the epitaxial layer 101E to the silicon substrate 101.

In the case of forming the epitaxial layer 101E, a thickness-direction concentration distribution can be generated in an operation of growing an in situ-doped epitaxial crystal, to form a potential gradient. Accordingly, a channel of the transfer transistor Tr12 can be formed depending on the potential gradient.

Figure 9:
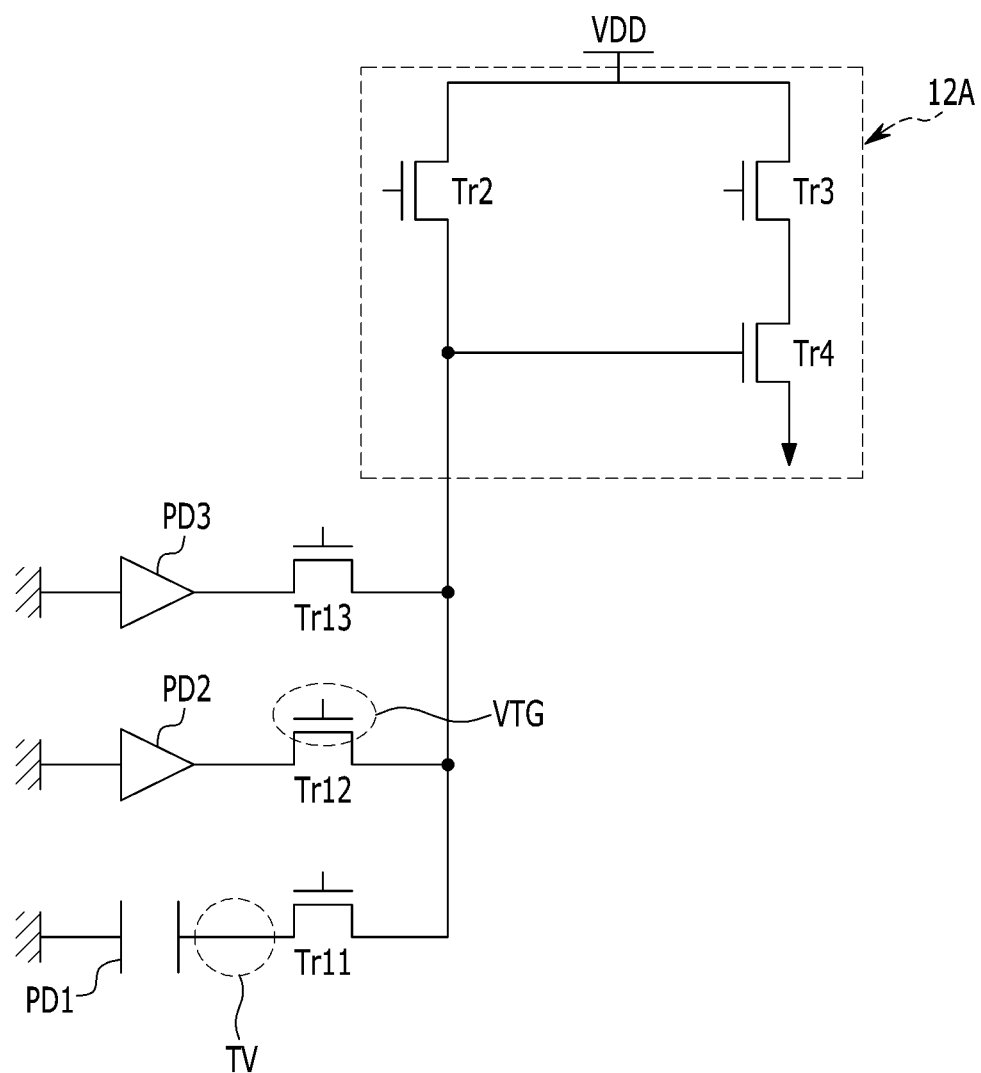
FIG. 9 illustrates an equivalent circuit diagram of an image sensor pixel according to example embodiments.

FIG. 9 illustrates an equivalent circuit diagram of an image sensor pixel according to example embodiments.

Different from the equivalent circuit diagram illustrated in FIG. 2, the charges accumulated in the organic light sensing element PD1 are transferred to the floating diffusion unit FD though the transfer transistor Tr11.

In example embodiments, a via for connecting the organic light sensing element PD1 with the transfer transistor Tr11 may be in the form of the through via TV (or 140). A gate (not illustrated) of the transfer transistor Tr11 may be included in the readout circuit 115 (see FIG. 3) of the substrate 101 (see FIG. 3). The floating diffusion unit FD may be formed in the substrate 101 (see FIG. 3) at a lower side of the readout circuit formation surface 110 (see FIG. 3) or in the epitaxial layer 101E (see FIG. 8).

Figure 10:
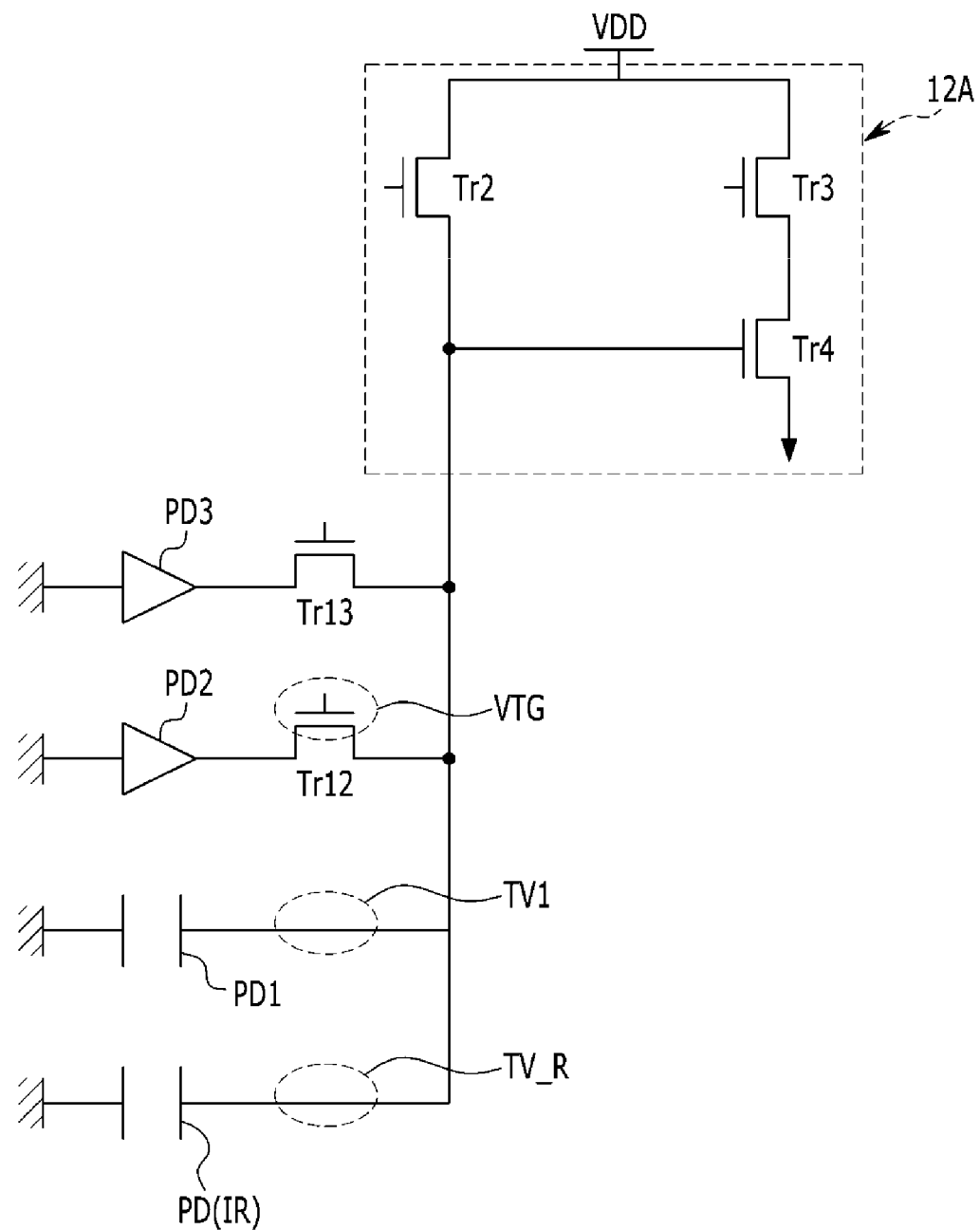
FIG. 10 illustrates an equivalent circuit diagram of an image sensor pixel according to example embodiments.

FIG. 10 illustrates an equivalent circuit diagram of an image sensor pixel according to example embodiments.

Different from the image sensor pixel illustrated in FIG. 2, a four-layer stacking light sensing element structure is provided by further including an infrared-ray sensing organic light sensing element PD(IR) that is disposed at a lower portion of the first organic light sensing element PD1 to selectively sense infrared rays.

Figure 11A:
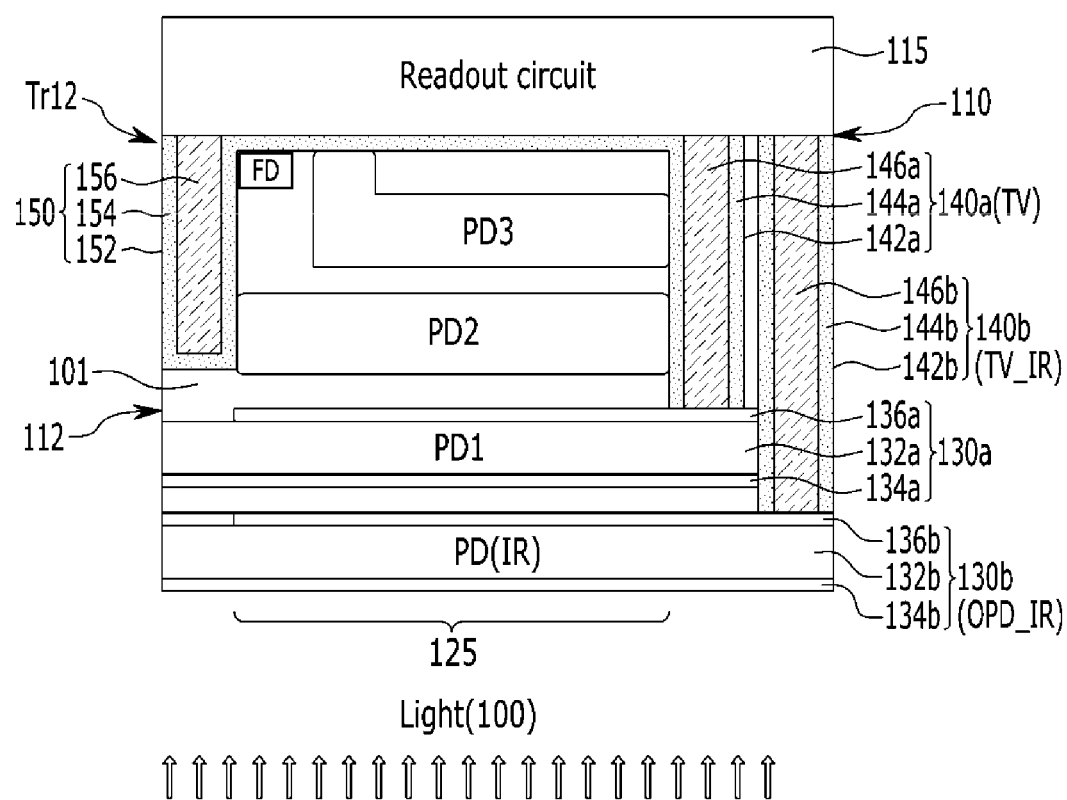
FIG. 11A and FIG. 11B illustrate cross-sectional views of an image sensor pixel including a four-layer stacking light sensing element structure.
Figure 11B:
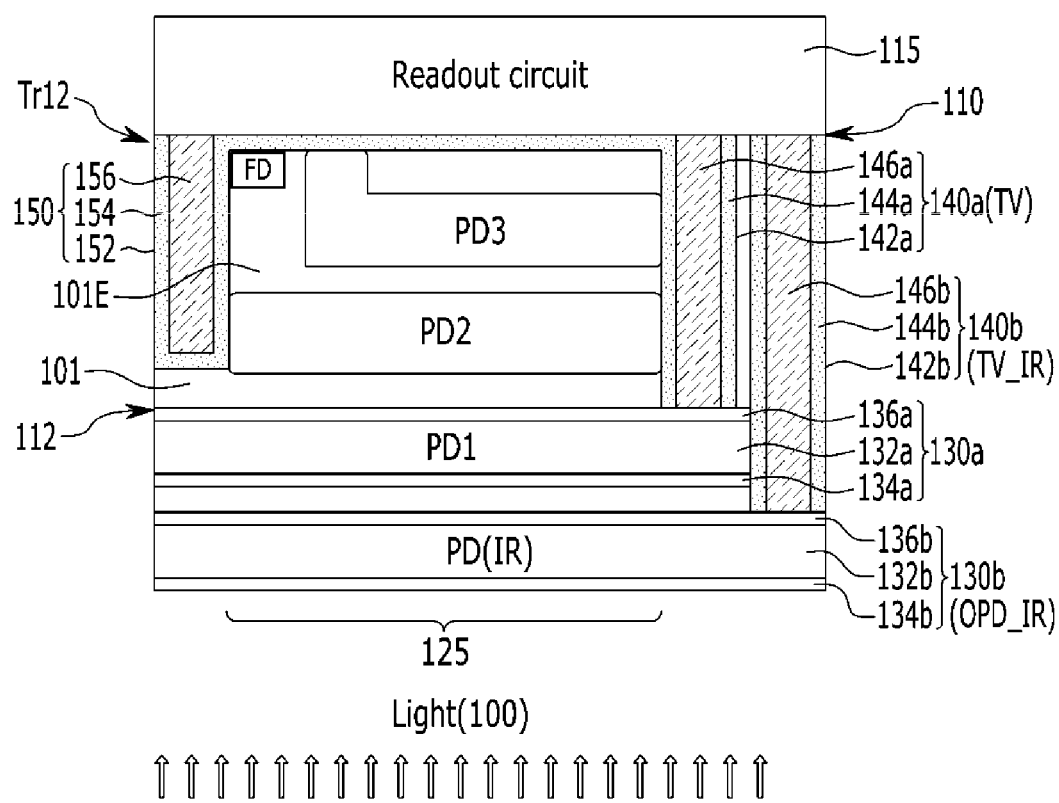

Accordingly, as illustrated in FIG. 11A and FIG. 11B, an image sensor pixel further includes a second through via 140b for transferring charges accumulated in the infrared-ray sensing organic light sensing element PD(IR) in addition to a first through via 140a and the vertical transfer gate 150.

The infrared-ray sensing organic light sensing element PD(IR) includes an organic photoelectric conversion layer 132*b* for sensing infrared rays, and a first electrode 134*b* and a second electrode 136*b* disposed at opposite surfaces thereof, respectively, and a second through via 140*b* is connected with the second electrode 136*b* which serves as a pixel electrode of the infrared-ray sensing organic light sensing element PD(IR).

FIG. 11A illustrates a case in which both the second light sensing element PD2 and the third light sensing element PD3 are formed in the silicon substrate 101, and FIG. 11B illustrates a case in which the second light sensing element PD2 is formed in the silicon substrate 101 and the third light sensing element PD3 is formed in the epitaxial layer 101E.

The second through via 140*b* may be formed to extend through the silicon substrate 101 and a first organic light sensing element 130*a* as illustrated in FIG. 11A or may be formed to extend through the epitaxial layer 101E, the silicon substrate 101, and the first organic light sensing element 130*a*.

Although a layout is not additionally illustrated, the through via 140*a*, the vertical transfer gate 150, and the second through via 140*b* may be disposed in less than half an area of an external circumferential surface or circumferential portion of the light-receiving portion or area by modifying the layouts illustrated in FIGS. 4 to 7.

When an on-signal is applied to the vertical transfer gate 150 in the pixel structure illustrated in FIG. 3, a channel region may be formed in a corresponding pixel as well as a pixel area adjacent thereto, to attract charges of the adjacent pixels. Accordingly, there may be a limit in reducing a distance between the adjacent pixel area and the vertical transfer gate 150. In other words, maintaining the size of a non-light-receiving portion or area 128, i.e., an area other than the light-receiving portion or area 125, may be maintained to be larger than the distance between the adjacent pixel area and the vertical transfer gate 150150 so as to attract the charges.

Figure 12:
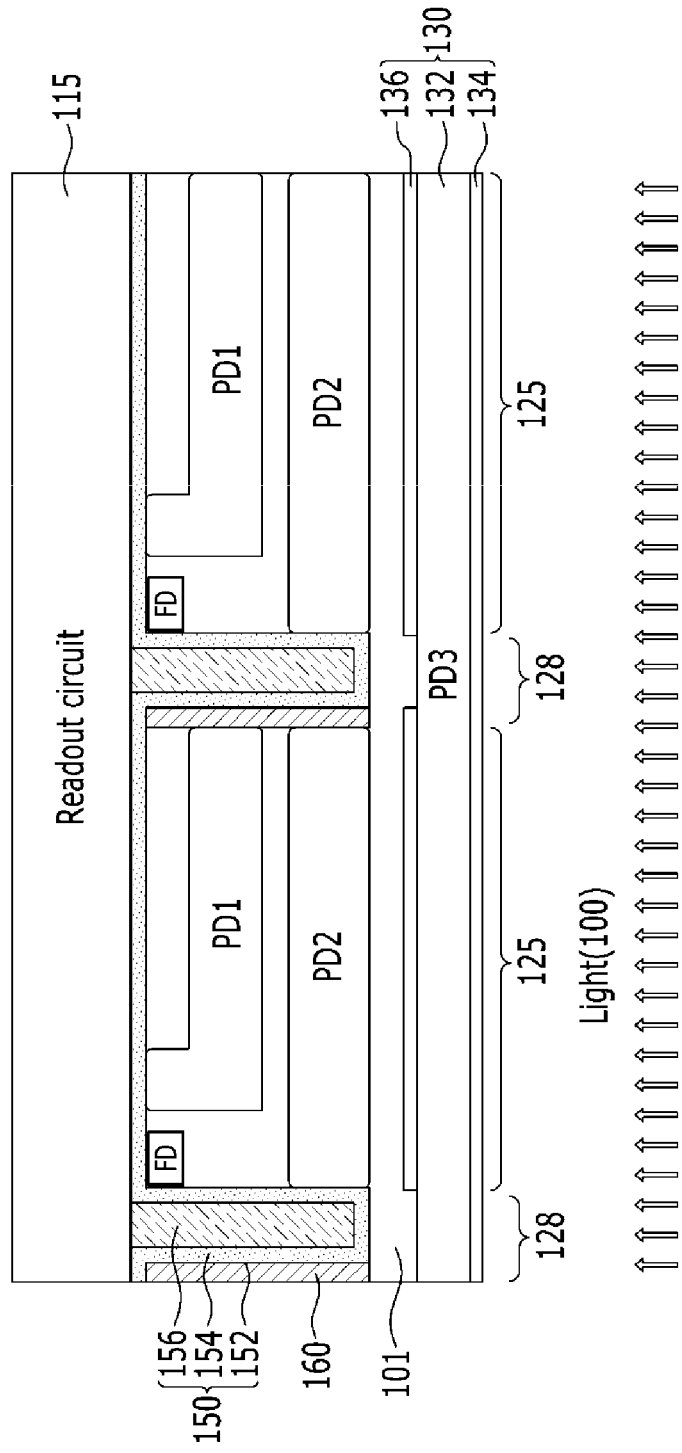
FIG. 12 illustrates a cross-sectional view of an image sensor pixel including a counter charge well according to example embodiments.

In contrast, according to example embodiments illustrated in FIG. 12, suppressing noise generation may be possible by forming a counter charge well 160 opposite to the channel.

Figure 13:
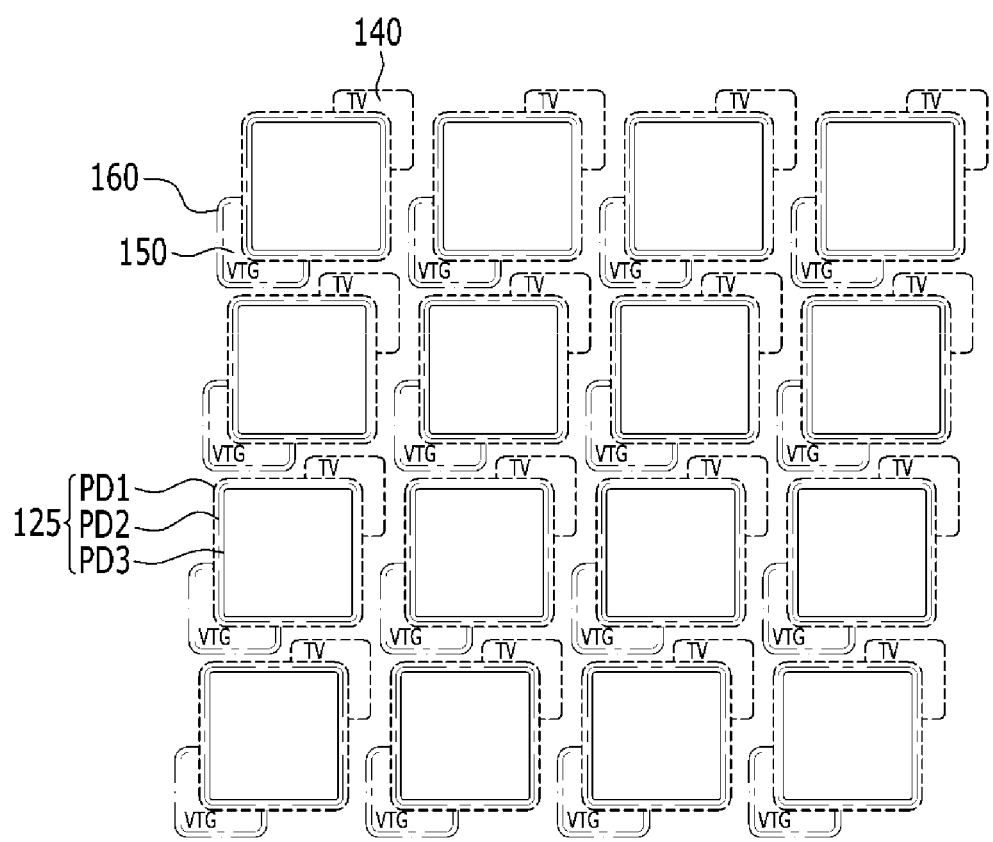
FIGS. 13-14 illustrate layouts of the image sensor pixel illustrated in FIG. 12.
Figure 14:
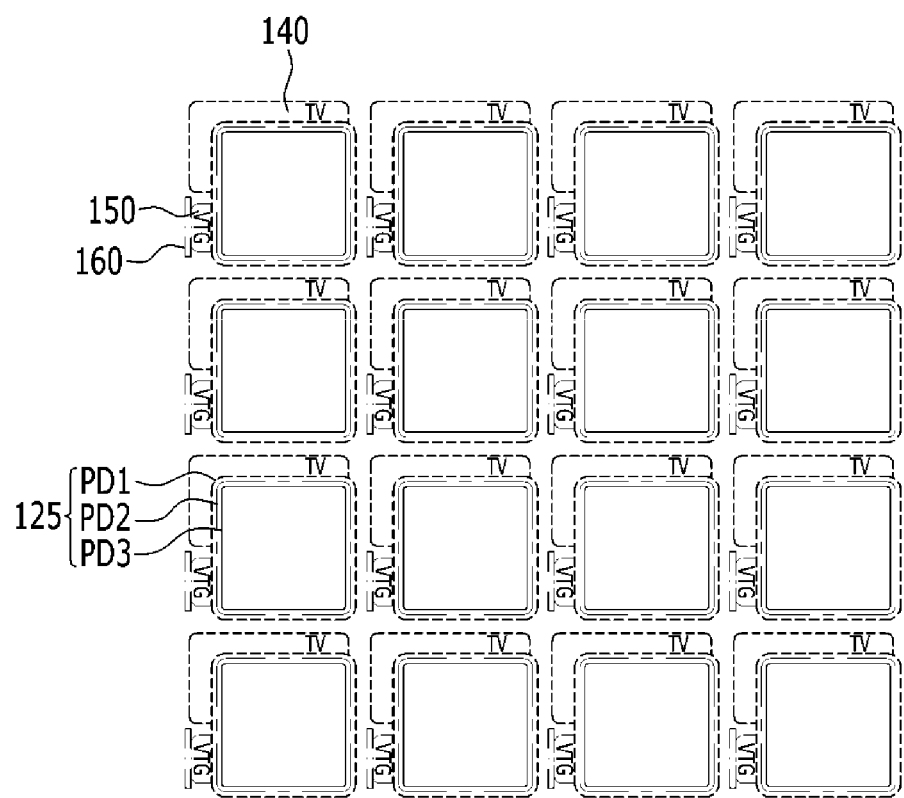

The counter charge well 160 may be formed along an entire external circumferential surface or circumferential portion of the vertical transfer gate 150 as illustrated in FIG. 13, or may be formed in an area opposite to adjacent pixels as illustrated in FIG. 14.

Accordingly, a distance between the pixel and the vertical transfer gate 150 can be reduced or minimized, and thus, reducing an area of the non-light-receiving portion or area 128 outside the light-receiving portion or area 125 may be possible.

Figure 15A:
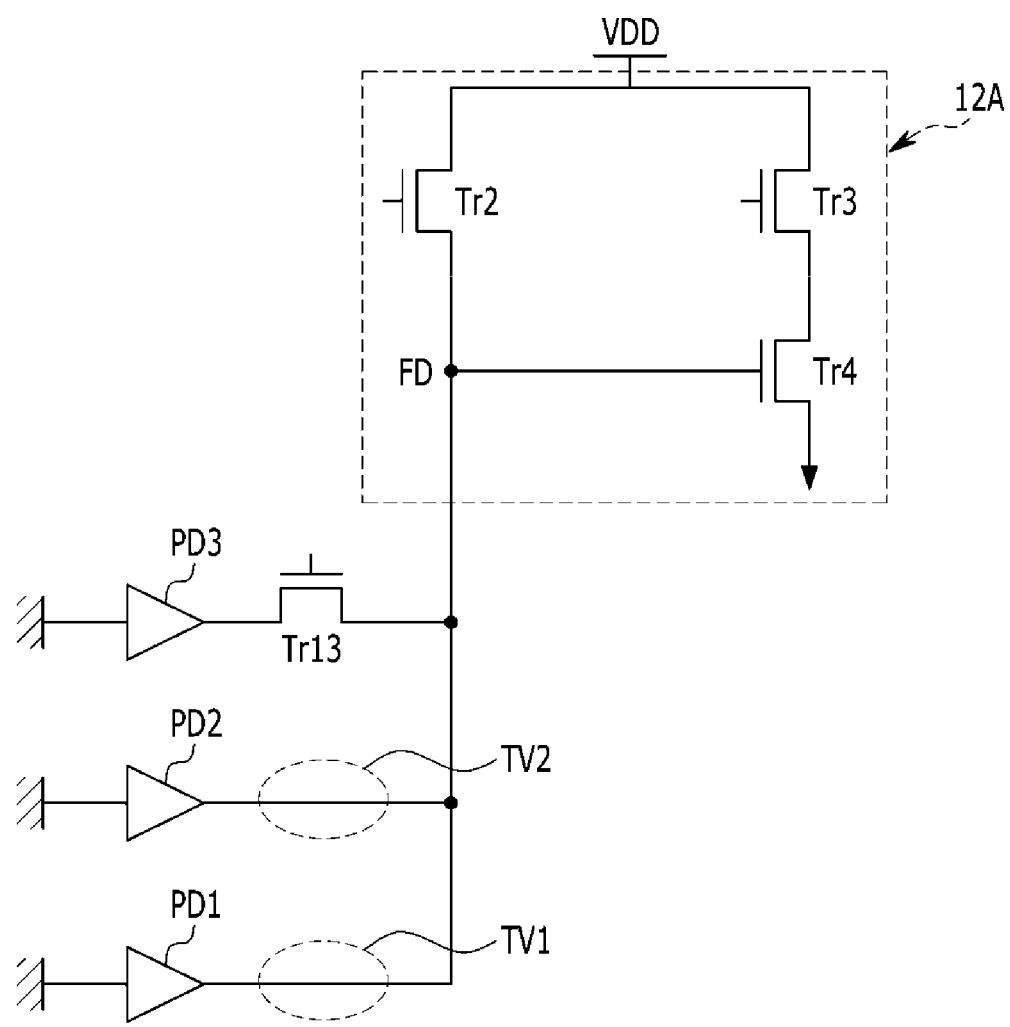
FIGS. 15A and 15B illustrate equivalent circuit diagrams of image sensor pixels according to example embodiments.
Figure 15B:
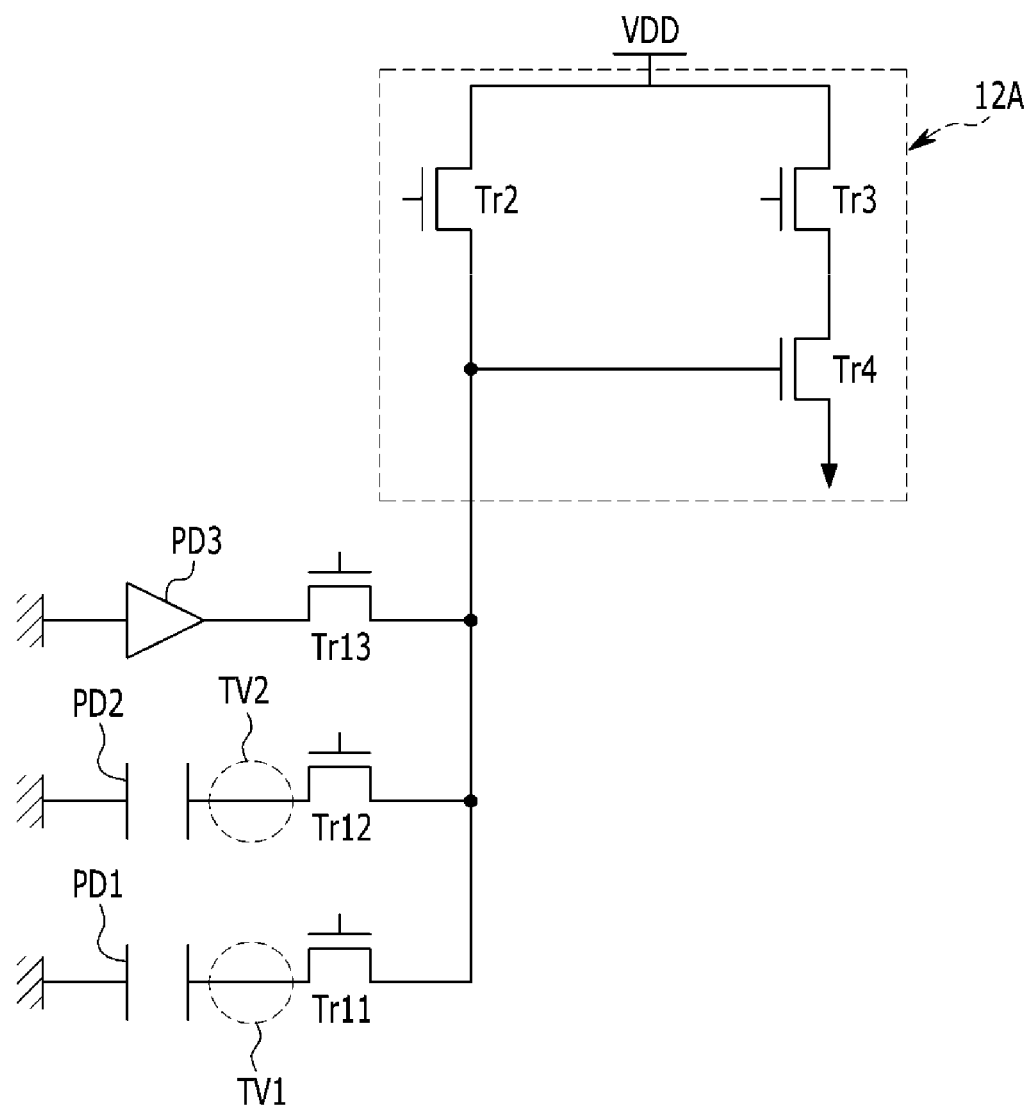

FIGS. 15A and 15B illustrate equivalent circuit diagrams of image sensor pixels according to example embodiments. The example embodiments illustrated in FIGS. 15A and 15B are different from the example embodiments illustrated in FIG. 2 or FIG. 9 in that the first light sensing element PD1 and the second light sensing element PD2 constituting the triple-stacking light sensing element structure are formed of organic light sensing elements, and the third light sensing element PD3 is formed of an inorganic light sensing element. FIG. 15A illustrates a case in which charges in the organic light sensing elements PD1 and PD2 are directly transferred to the floating diffusion unit FD connected with a gate of the amplifying transistor Tr4 without using the transfer transistor, and FIG. 15B illustrates a case in which the charges in the organic light sensing elements PD1 and PD2 are transferred to the floating diffusion unit FD through the transfer transistors Tr11 and Tr12.

Figure 16:
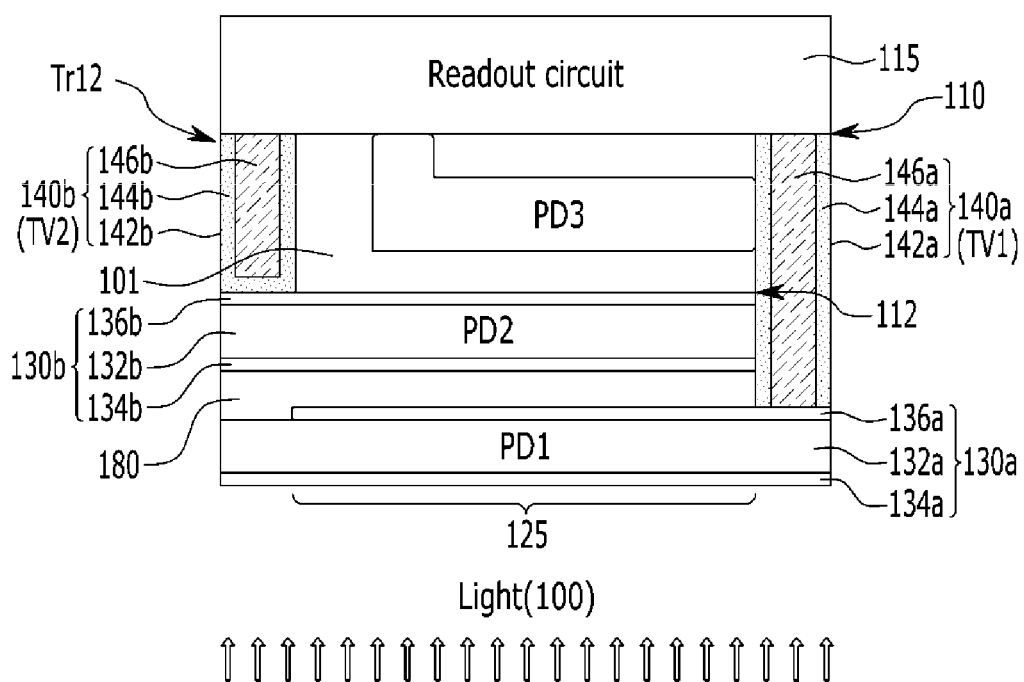
FIG. 16 illustrates a cross-sectional view of the image sensor pixel illustrated in FIGS. 15A and 15B.

FIG. 16 illustrates a cross-sectional view of the image sensor pixel illustrated in FIG. 15A and FIG. 15B. Referring to FIG. 16, the charges of the first organic light sensing element PD1 are transferred to the readout circuit 115 through the first through via 140*a*, and the charges of the second organic light sensing element PD2 are transferred to the readout circuit 115 through the second through via 140*b*.

The first through via 140*a* is connected with a second electrode 136*a* which is extended through the substrate 101, the second organic light sensing element PD2, and an insulating layer 180 to serve as a pixel electrode of the first organic light sensing element PD1.

The second through via 140*b* is connected with the second electrode 136*b* which is extended through the substrate 101 to serve as a pixel electrode of the second organic light sensing element PD2.

The first organic light sensing element 130*a* (or PD1) may include an organic photoelectric conversion layer 132*a* for selectively absorbing first visible light, and a first electrode 134*a* and a second electrode 136*a* disposed at opposite surfaces thereof, and a second organic light sensing element 130*b* (or PD2) may include an organic photoelectric conversion layer 132*b* for selectively absorbing second visible light, and a first electrode 134*b* and a second electrode 136*b* disposed at opposite surfaces thereof.

The triple-layer stacking structure (PD1/PD2/PD3) can be formed by various combinations of 1) an organic light sensing element OPD(b) for blue light/an organic light sensing element OPD(g) for green light/an inorganic light sensing element PD(r) for red light, 2) an organic light sensing element OPD(b) for blue light/an organic light sensing element OPD(g) for red light/an inorganic light sensing element PD(r) for green light, or 3) an infrared-ray sensing organic light sensing element OPD(ir)/an organic light sensing element OPD(g) for green light/an inorganic light sensing element array for red and blue light (PD(r) & PD(b)).

According to example embodiments, adjacent pixels constitute deep trench isolation (DTI) by a first through via 140*a* and a second through via 140*b*.

FIGS. 17 to 20 illustrate layouts for effectively accomplishing isolation of pixels of image sensors illustrated in FIGS. 15A to 16.

Referring to FIGS. 17 to 20, the first through via 140*a* and the second through via 140*b* are disposed in an external circumferential surface or circumferential portion of the light-receiving portion or area 125 in which the three stacking light sensing elements PD1, PD2, and PD3 are stacked.

Figure 17:
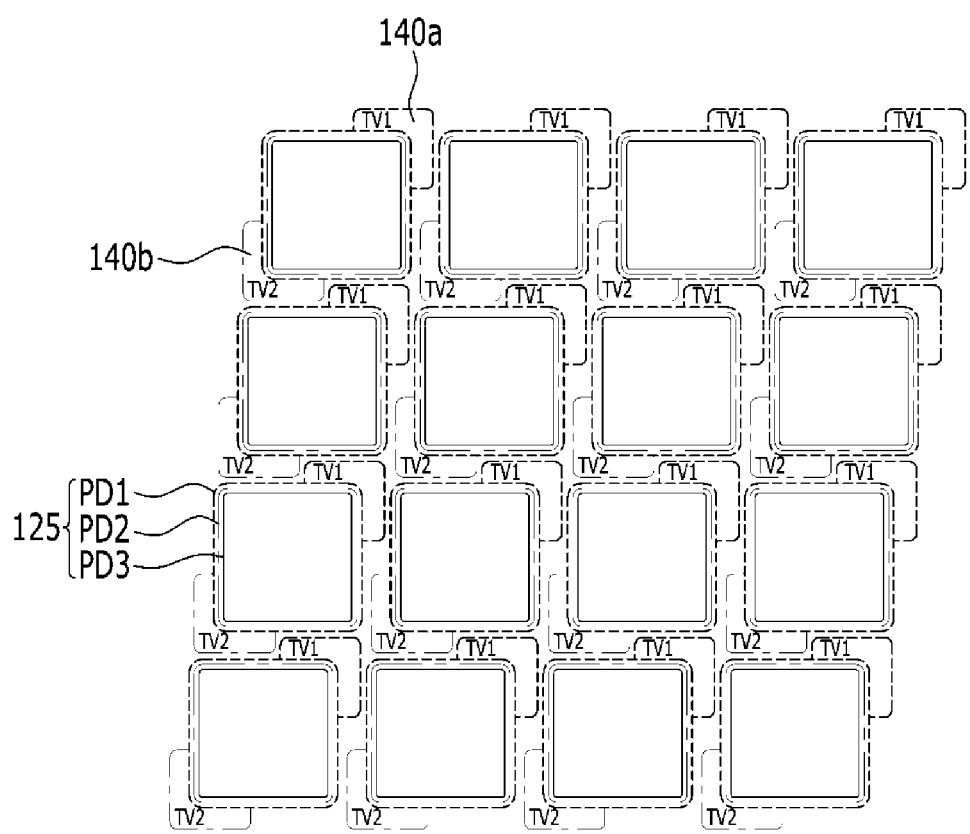
FIGS. 17 to 20 illustrate layouts for effectively accomplishing isolation of pixels of image sensors illustrated in FIGS. 15A to 16.
Figure 18:
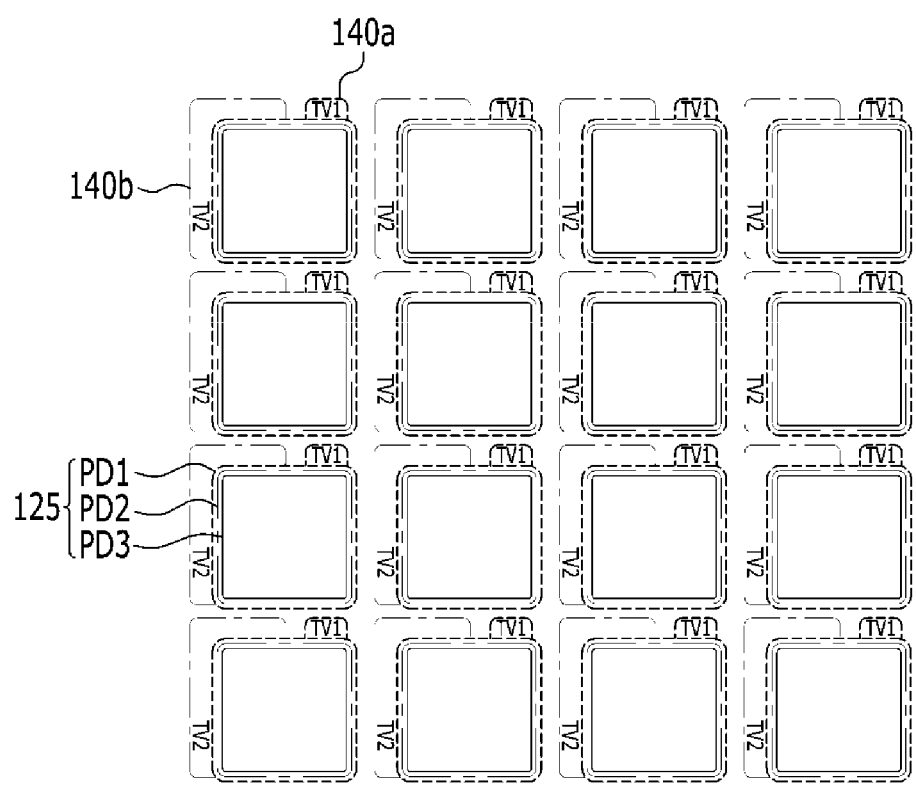
Figure 19:
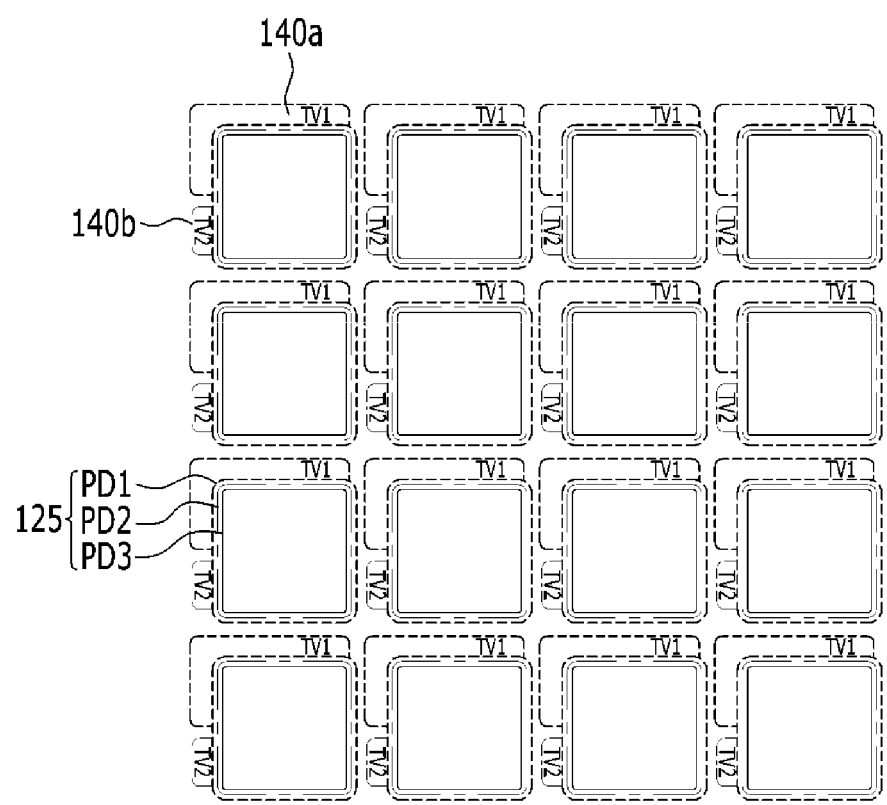
Figure 20:
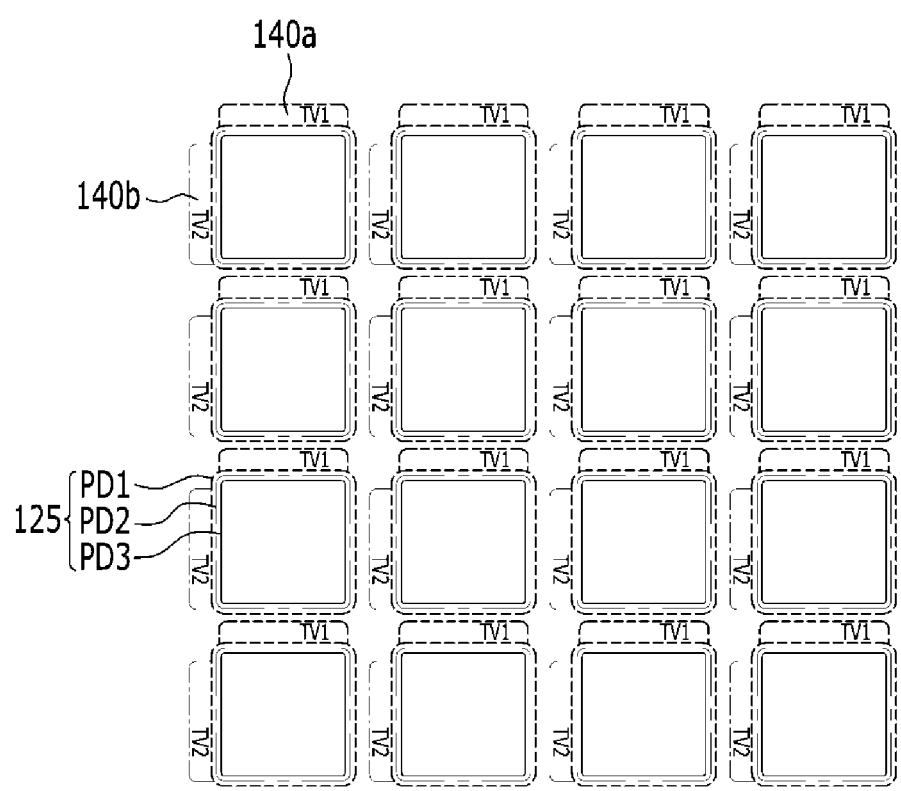

FIG. 17 illustrates a case in which the first through via 140*a* and the second through via 140*b* are disposed in an L-shaped pattern in the external circumferential surface or circumferential portion of the light-receiving portion or area 125. FIG. 18 illustrates a case in which the first through via 140*a* is disposed in a 1-shaped pattern and the second through via 140*b* is disposed in the L-shaped pattern. FIG. 19 illustrates a case in which the first through via 140*a* is disposed in the L-shaped pattern, and the second through via 140*b* illustrates a case in which the first through via 140*a* is disposed in the 1-shaped pattern. FIG. 20 illustrates a case in which both the first through via 140*a* and the second through via 140*b* are disposed in the 1-shaped pattern.

As illustrated in FIGS. 17 to 20, the first through via 140*a* and the second through via 140*b* may be disposed in less than half an area of the external circumferential surface or circumferential portion of the light-receiving portion or area 125 at a maximum to thereby improve or optimize the DTI between light-receiving portions or areas 125 of pixels. Further, accomplishing effective DTI between adjacent pixels may be possible by forming the first through via 140*a* and the second through via 140*b* through less than a half area of the external circumferential surface or circumferential portion of the light-receiving portion or area 125 as the DTI between the light-receiving portion or areas 125 of the pixels.

In addition, the area occupied by the light-receiving portion or area 125 can be increased by disposing the first through via 140*a* and the second through via 140*b* outside the light-receiving portion or area 125, thereby improving a fill factor.

Furthermore, the first through via 140*a* and the second through via 140*b* can be designed in the 1 or L shape to simplify processes, thereby improving processability.

Referring again to FIG. 3, an insulating layer 144*a* constituting the through via 140*a* and an insulating layer 144*b* of the second through via 140*b* may be formed of a material having a lower refractive index than that of the material of the substrate 101, thereby improving optical crosstalk. For example, the insulating layer 144*a* and the insulating layer 144*b* may be formed of an oxide, a nitride, etc., having a refractive index that is lower than that of silicon.

Figure 21A:
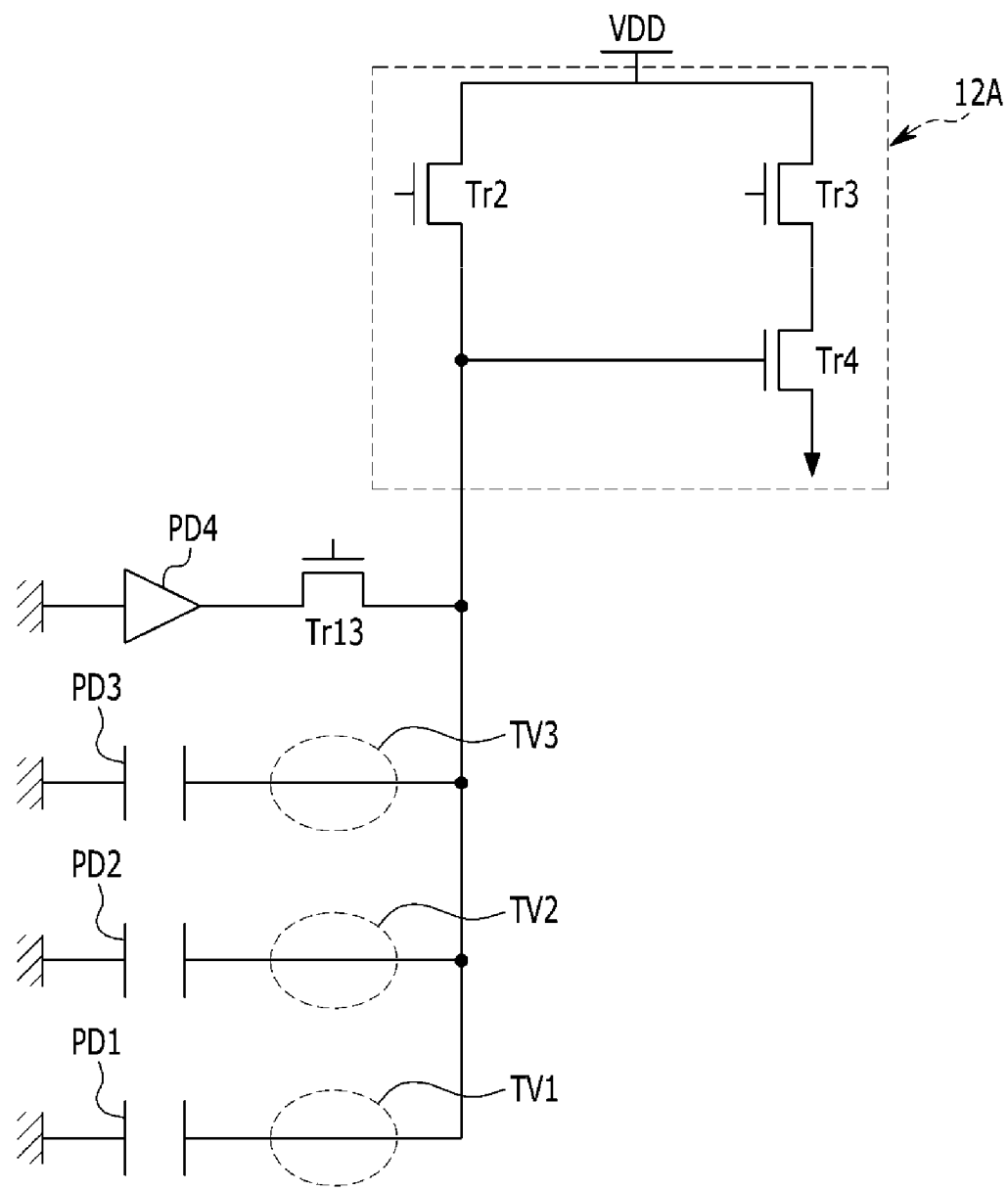
FIGS. 21A and 21B illustrate equivalent circuit diagrams of image sensor pixels according to example embodiments.
Figure 21B:
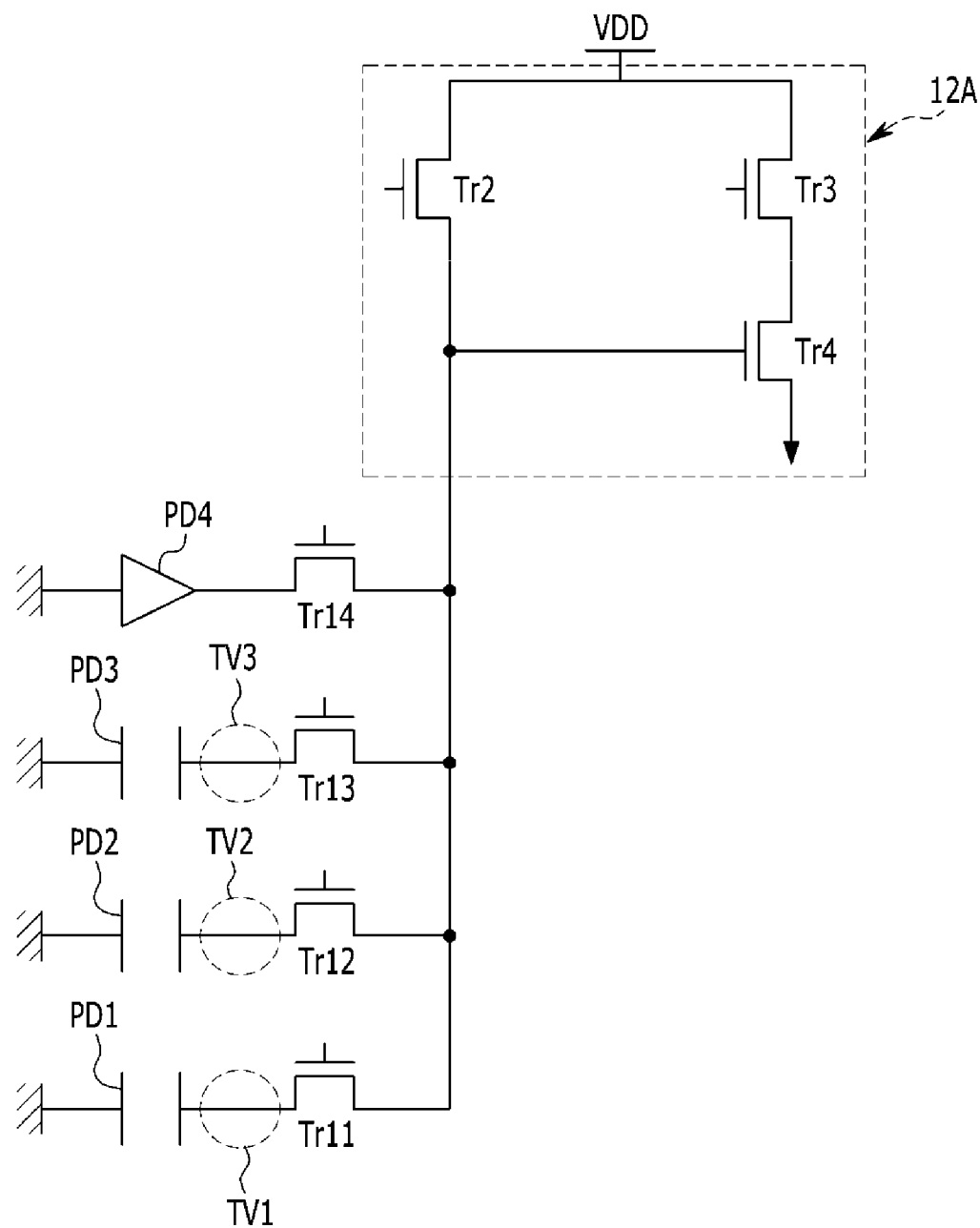

FIGS. 21A and 21B illustrate equivalent circuit diagrams of image sensor pixels according to example embodiments.

The circuit diagrams illustrated in FIGS. 21A and 21B are different from the aforementioned example embodiments in that each light sensing element structure thereof is formed to have a four-layer stacking light sensing element structure, and a lower triple structure is formed of organic light sensing elements.

Figure 22:
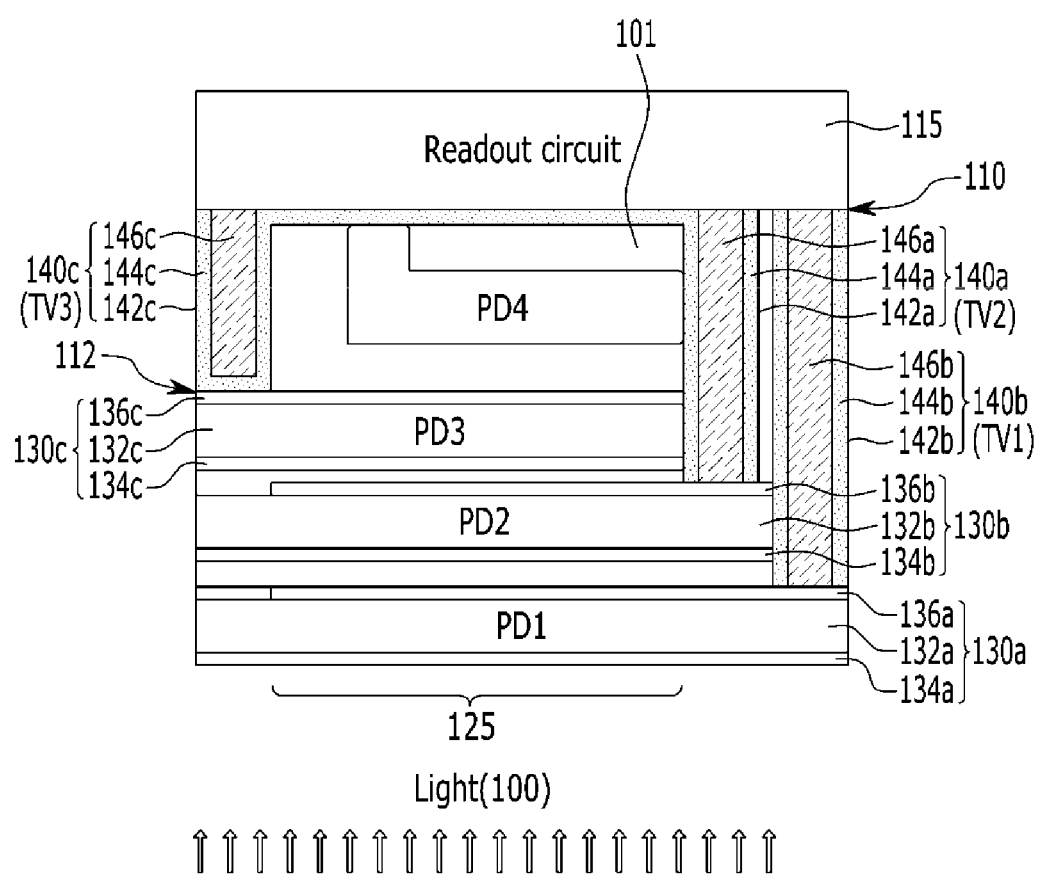
FIG. 22 illustrates a cross-sectional view of the image sensor pixel illustrated in FIGS. 21A and 21B.

Accordingly, as illustrated in the equivalent circuit diagrams of FIGS. 21A and 21B, and in a cross-sectional view of FIG. 22, each of the organic light sensing elements PD1, PD2, and PD3 respectively transfers accumulated charges to the readout circuit 115 through first to third vias 140*a*, 140*b*, and 140*c*.

Although layouts of the first to third vias 140*a*, 140*b*, and 140*c* are not shown, the first to third vias 140*a*, 140*b*, and 140*c* can be disposed in less than half an area of the external circumferential surface or circumferential portion of the light-receiving portion or area 125.

This four-layer stacking structure (PD1/PD2/PD3/PD4) may be configured to include an organic light sensing element OPD(b) for blue light/an organic light sensing element OPD(g) for green light/an organic light sensing element OPD(r) for red light/an inorganic light sensing element PD(IR) for infrared rays.

As such, when a light sensing element for infrared rays is formed in addition to the stacking structure of three light sensing elements, the light sensing element for infrared rays may autonomously selectively absorb light, thereby reducing or preventing noise generation. Further, in some cases, the light sensing element for infrared rays may additionally perform photoelectric conversion to improve sensitivity or realize a security recognition process, etc.

Figure 23:
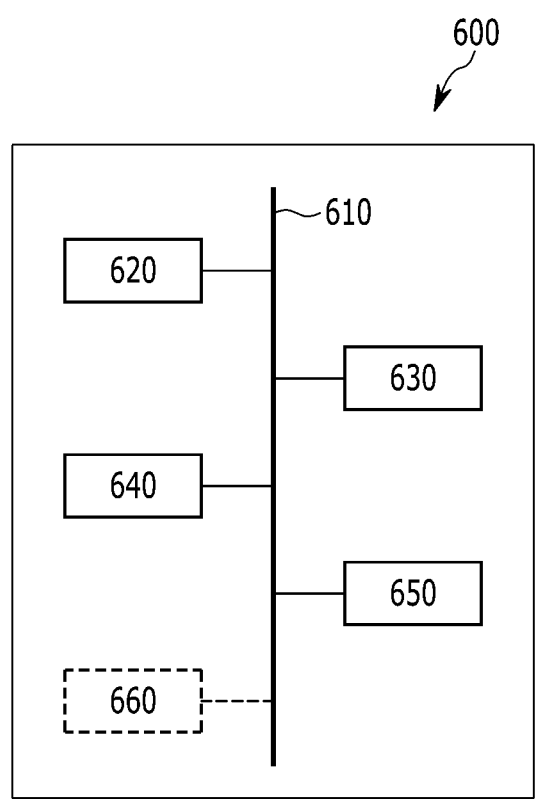
FIG. 23 is a diagram illustrating an electronic device 600 according to example embodiments.

FIG. 23 is a diagram illustrating an electronic device 600 according to some example embodiments.

Referring to FIG. 23, the electronic device 600 includes a memory 620, a processor 630, an image sensor 640, and a communication interface 650. The image sensor 640 may include any of the image sensors illustrated and described herein.

The electronic device 600 may be included in one or more various electronic devices, including, for example, a mobile phone, a digital camera, a mobile phone camera, a camcorder, etc. In example embodiments, the electronic device 600 may include one or more of an image providing server, a mobile device, a computing device, an image outputting device, and an image capturing device. A mobile device may include a mobile phone, a smartphone, a personal digital assistant (PDA), some combination thereof, or the like. A computing device may include a personal computer (PC), a tablet computer, a laptop computer, a netbook, some combination thereof, etc. An image outputting device may include a TV, a smart TV, some combination thereof, etc. An image capturing device may include a camera, a camcorder, some combination thereof, etc.

The memory 620, the processor 630, the image sensor 640, and the communication interface 650 may communicate with one another through a bus 610.

The communication interface 650 may communicate data from an external device using various Internet protocols. For example, the communication interface 650 may communicate sensor data generated by the image sensor 640 to an external device. The external device may include, for example, an image providing server, a display device, a mobile device including, a mobile phone, a smartphone, a personal digital assistant (PDA), a tablet computer, and a laptop computer, a computing device including a personal computer (PC), a tablet PC, and a netbook, an image outputting device including a TV and a smart TV, and an image capturing device including a camera and a camcorder.

The processor 630 may execute a program and control the electronic device 600. A program code to be executed by the processor 630 may be stored in the memory 620. An electronic system may be connected to an external device through an input/output device (not shown) and exchange data with the external device.

The memory 620 may store information output from the image sensor 640, including information transmitted from the transistor 90. The memory 620 may be a volatile or a nonvolatile memory. The memory 620 may be a non-transitory computer readable storage medium. The memory may store computer-readable instructions that, when executed, cause the execution of one or more methods, functions, processes, etc. as described herein. In some example embodiments, the processor 630 may execute one or more of the computer-readable instructions stored at the memory 620.

In some example embodiments, the electronic device may include a display panel 660 that may output an image generated based at least in part upon information output from the image sensor 640.

In some example embodiments, element 660 may be absent from the electronic device 600. In some example embodiments, the communication interface 650 may include a USB and/or HDMI interface. In some example embodiments, the communication interface 650 may include a wireless communication interface.

While the inventive concepts have been described in connection with what is presently considered to be practical example embodiments, it is to be understood that the inventive concepts are not limited to the disclosed embodiments, but, on the contrary, is intended to cover various modifications and equivalent arrangements included within the spirit and scope of the appended claims.

What is claimed is:

1. An image sensor comprising:
a plurality of pixels, each of the pixels including,
a light sensing structure including a first light sensing element, a second light sensing element, and a third light sensing element sequentially stacked, the light sensing structure having a first surface and a second surface, the first surface adjacent to a readout circuit and the second surface including a light receiving portion between first and second circumferential portions on either side of the light receiving portion;

a first through via on the first circumferential portion of the second surface and extending from the first surface to connect with the first light sensing element, the first through via configured to transfer charges of the first light sensing element to the readout circuit; and a vertical transfer gate on the second circumferential portion of the second surface, the vertical transfer gate extending from the second light sensing element to the first surface to contact the readout circuit, wherein the first through via and the vertical transfer gate of each of the plurality of pixels are arranged in one of a quadrangular shaped and L-shaped pattern in a planar view in the respective first and second circumferential portions, thereby isolating the first light sensing element and the second light sensing element from the first light sensing element and the second light sensing element of adjacent pixels.

2. The image sensor of claim 1, wherein an area occupied by the first through via and the vertical transfer gate is less than half an area of the first and second circumferential portions.

3. The image sensor of claim 1, wherein
the second surface is opposite the first surface; and
the first light sensing element is an organic light sensing element.

4. The image sensor of claim 1, wherein
the vertical transfer gate is formed in a trench in a substrate, the trench connected with the second light sensing element; and
the vertical transfer gate includes,
a gate insulating layer along an inner side wall and a bottom surface of the trench, and
a vertical transfer gate electrode on the gate insulating layer to bury the trench.

5. The image sensor of claim 4, wherein
the first through via is formed in a via hole penetrating the substrate to expose the first light sensing element; and
the first through via includes,
an insulating layer along an inner side wall of the via hole, and
a conductive layer on the insulating layer to bury the via hole; and
the insulating layer and the gate insulating layer include a material having a refractive index lower than a refractive index of the substrate.

6. The image sensor of claim 1, wherein
the first light sensing element is an organic light sensing element;
the first light sensing element includes an organic photoelectric conversion layer, a pixel electrode on a first surface of the organic photoelectric conversion layer, and a common electrode on a second surface of the organic photoelectric conversion layer opposite the first surface; and
the first through via is connected with the pixel electrode.

7. The image sensor of claim 1, further comprising:
a counter charge well along a circumferential surface of the vertical transfer gate.

8. The image sensor of claim 1, further comprising:
an infrared-ray sensing organic light sensing element in-disposed on a lower portion of the first light sensing element, the infrared-ray sensing organic light sensing element configured to selectively absorb infrared rays; and a second through via extending from the first surface to connect with the infrared-ray sensing organic light sensing element, the second through via configured to transfer charges of the infrared-ray sensing organic light sensing element to the readout circuit, wherein an area occupied by the first through via, the vertical transfer gate, and the second through via is less than half an area of the light receiving portion.

9. An image sensor comprising:
a plurality of pixels, each of the pixels including,
a light sensing structure including a first light sensing element, a second light sensing element, and a third light sensing element sequentially stacked on a substrate, the light sensing structure having a first surface and a second surface, the first surface adjacent to a readout circuit and the second surface including a light receiving portion and a circumferential portion on one side of the light receiving portion;

a first through via on the circumferential portion of the second surface and extending from the first surface to the first light sensing element, the first through via configured to transfer charges of the first light sensing element to the readout circuit; and a second through via on the circumferential portion of the second surface and extending from the first surface to the second light sensing element, the second through via configured to transfer charges of the second light sensing element to the readout circuit, wherein the first through via and the second through via of each of the plurality of pixels are arranged in one of a quadrangular shaped and L-shaped pattern in a planar view in the circumferential portion, thereby isolating the first light sensing element and the second light sensing element from the first light sensing element and the second light sensing element of adjacent pixels.

10. The image sensor of claim 9, wherein an area occupied by the first through via and the second through via is less than half an area of the circumferential portion.

11. The image sensor of claim 9, wherein
the second surface is opposite the first surface;
the first light sensing element is a first organic light sensing element configured to selectively sense first visible light;
the second light sensing element is a second organic light sensing element configured to selectively sense second visible light;
the first and second through vias are formed in via holes penetrating the substrate to expose the respective first and second light sensing elements;
each of the first and second through vias include an insulating layer along an inner side wall of the respective via hole and a conductive layer on the respective insulating layer to bury the respective via hole; and
the insulating layer of the first and second through vias includes a material having a refractive index that is lower than a refractive index of the substrate.

12. The image sensor of claim 11, wherein the light sensing structure is one of a stacking structure of an organic light sensing element OPD(b) for blue light/an organic light sensing element OPD(g) for green light/an inorganic light sensing element PD(r) for red light, a stacking structure of an organic light sensing element OPD(b) for blue light/an organic light sensing element OPD(g) for red light/an inorganic light sensing element PD(r) for green light, and a stacking structure of a sensing organic light sensing element OPD(ir) for infrared rays/an organic light sensing element OPD(g) for green light/a red and blue inorganic light sensing element array for red and blue light (PD(r) & PD(b)).

13. The image sensor of claim 11, wherein the light sensing structure includes an organic light sensing element disposed on a lower portion of the first light sensing element, further comprising:
   a third through via extending from the first surface to connect with the organic light sensing element, the third through via configured to transfer charges of the organic light sensing element to the readout circuit,
   wherein an area occupied by the first through via, the second through via, and the third through via is less than half an area of the light receiving portion.

14. The image sensor of claim 13, wherein the light sensing structure includes a stacking structure of an organic light sensing element OPD(b) for blue light/an organic light sensing element OPD(g) for green light/an organic light sensing element OPD(r) for red light/an inorganic light sensing element PD(IR) for infrared rays.

15. An image sensor comprising:
   a plurality of pixels, each of the pixels including,
   a light sensing structure including a first light sensing element and a second light sensing element disposed in a semiconductor substrate and a third light sensing element disposed on the semiconductor substrate, the light sensing structure having a first surface and a second surface, the first surface adjacent to a readout circuit and the second surface including a light receiving portion;
   a first through via formed in the semiconductor substrate and extending from the first surface to the first light sensing element, the first through via configured to transfer charges of the first light sensing element to the readout circuit; and
   a vertical transfer gate formed in the semiconductor substrate and extending from the first surface to the second light sensing element, the vertical transfer gate configured to transfer charges of the second light sensing element to the readout circuit,
   wherein adjacent pixels of the plurality of pixels are optically isolated by an insulating layer formed along an inner side wall of the first through via and a gate insulating layer of the vertical transfer gate.

16. The image sensor of claim 15, wherein
   the first through via and the vertical transfer gate of each of the plurality of pixels are arranged in one of a quadrangular shaped and L-shaped pattern in a planar view in circumferential portions adjacent the light receiving portion; and
   an area occupied by the first through via and the vertical transfer gate is less than half an area of the circumferential portions.

17. The image sensor of claim 15, wherein
   the second surface is opposite the first surface;
   the first light sensing element is an organic light sensing element;
   the first light sensing element includes an organic photoelectric conversion layer, a pixel electrode on a first surface of the organic photoelectric conversion layer, and a common electrode on a second surface of the organic photoelectric conversion layer opposite the first surface; and
   the first through via is connected with the pixel electrode.

18. The image sensor of claim 15, wherein the insulating layer and the gate insulating layer include a material having a refractive index lower than a refractive index of the substrate.

19. The image sensor of claim 15, further comprising:
   a counter charge well along a circumferential surface of the vertical transfer gate.

20. The image sensor of claim 15, further comprising:
   an infrared-ray sensing organic light sensing element in a lower portion of the first light sensing element, the infrared-ray sensing organic light sensing element configured to selectively absorb infrared rays; and
   a second through via extending from the first surface to connect with the infrared-ray sensing organic light sensing element, the second through via configured to transfer charges of the infrared-ray sensing organic light sensing element to the readout circuit,
   wherein an area occupied by the first through via, the vertical transfer gate, and the second through via is less than half an area of the light receiving portion.

21. An image sensor comprising:
   a plurality of pixels, each of the pixels including,
   a light sensing structure including a first light sensing element, a second light sensing element, and a third light sensing element sequentially stacked on a substrate, the light sensing structure having a first surface and a second surface, the first surface adjacent to a readout circuit and the second surface including a light receiving portion;
   a first through via formed in the substrate and extending from the first surface to the first light sensing element, the first through via configured to transfer charges of the first light sensing element to the readout circuit; and
   a second through via formed in the substrate and extending from the first surface to the second light sensing element, the second through via configured to transfer charges of the second light sensing element to the readout circuit,
   wherein adjacent pixels of the plurality of pixels are optically isolated by an insulating layer formed along inner side walls of the first through via and the second through via.

22. The image sensor of claim 21, wherein
   the first through via and the second through via of each of the plurality of pixels are arranged in one of a quadrangular shaped and L-shaped pattern in a planar view in a circumferential portion adjacent the light receiving portion; and
   an area occupied by the first through via and the second through via is less than half an area of the circumferential portion.

23. The image sensor of claim 21, wherein
   the second surface is opposite the first surface;
   the first light sensing element is a first organic light sensing element configured to selectively sense first visible light;
   the second light sensing element is a second organic light sensing element configured to selectively sense second visible light;
   the first and second through vias are formed in via holes penetrating the substrate to expose the respective first and second light sensing elements;
   each of the first and second through vias include an insulating layer along an inner side wall of the respective via hole and a conductive layer on the respective insulating layer to bury the respective via hole; and the insulating layer of the first and second through vias includes a material having a refractive index that is lower than a refractive index of the substrate.

24. The image sensor of claim 23, wherein the light sensing structure includes an organic light sensing element disposed on a lower portion of the first light sensing element, further comprising:
  a third through via extending from the first surface to connect with the organic light sensing element, the third through via configured to transfer charges of the organic light sensing element to the readout circuit,
  wherein adjacent pixels of the plurality of pixels are electrically isolated by the insulating layer along inner side walls of the first through via and the second through via, and an insulating layer along inner side walls of the third through via.

25. An electronic device comprising the image sensor of claim 1.

26. An electronic device comprising the image sensor of claim 9.

27. An electronic device comprising the image sensor of claim 15.

28. An electronic device comprising the image sensor of claim 21.

* * * * *